United States Patent
Kandala et al.

(10) Patent No.: US 11,625,638 B2
(45) Date of Patent: Apr. 11, 2023

(54) DRIVE ENHANCED J/ZZ OPERATION FOR SUPERCONDUCTING QUBITS

(71) Applicant: International Business Machines Corporation, Armonk, NY (US)

(72) Inventors: Abhinav Kandala, Yorktown Heights, NY (US); David C. Mckay, Ossining, NY (US); Isaac Lauer, Chappaqua, NY (US); Easwar Magesan, Mount Kisco, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 17/324,624

(22) Filed: May 19, 2021

(65) Prior Publication Data
US 2022/0383169 A1 Dec. 1, 2022

(51) Int. Cl.
*G06N 10/00* (2022.01)
*G06F 9/38* (2018.01)
*G06F 9/448* (2018.01)
*H03K 19/195* (2006.01)

(52) U.S. Cl.
CPC ........... *G06N 10/00* (2019.01); *G06F 9/3877* (2013.01); *G06F 9/4494* (2018.02); *H03K 19/195* (2013.01)

(58) Field of Classification Search
CPC ..... G06F 9/3877; G06F 9/4494; G06N 10/00; H03K 19/195
See application file for complete search history.

(56) References Cited

U.S. PATENT DOCUMENTS

| | | | |
|---|---|---|---|
| 9,444,430 B1 | 9/2016 | Abdo et al. | |
| 9,501,748 B2 | 11/2016 | Naaman et al. | |
| 9,727,823 B2 | 8/2017 | Amin et al. | |
| 10,074,056 B2 | 9/2018 | Epstein | |
| 10,311,369 B2 | 6/2019 | Epstein | |
| 10,452,991 B1 | 10/2019 | Ganzhorn et al. | |
| 10,467,544 B2 | 11/2019 | Flipp et al. | |
| 10,546,994 B1 | 1/2020 | Dial et al. | |

(Continued)

FOREIGN PATENT DOCUMENTS

| | | |
|---|---|---|
| CN | 110378482 | 10/2019 |
| CN | 111931940 | 11/2020 |

(Continued)

OTHER PUBLICATIONS

Koch et al., "Charge insensitive qubit design derived from the Cooper pair box," Phys. Rev. A 76, 042319 (2007), 21 pages.

(Continued)

*Primary Examiner* — Kurtis R Bahr
(74) *Attorney, Agent, or Firm* — Amin, Turocy & Watson, LLP

(57) ABSTRACT

Systems, devices, computer-implemented methods, and/or computer program products that facilitate dynamic control of ZZ interactions for quantum computing devices. In one example, a quantum device can comprise a biasing component that is operatively coupled to first and second qubits via respective first and second drive lines. The biasing component can facilitate dynamic control of ZZ interactions between the first and second qubits using continuous wave (CW) tones applied via the respective first and second drive lines.

24 Claims, 12 Drawing Sheets

─ 1700

1710 — Coupling, by a system operatively coupled to a processor, a biasing component to first and second qubits via respective first and second drive lines 1720 — Using, by the system, the biasing component to dynamically control ZZ interactions between the first and second qubits with continuous wave (CW) tones applied via the respective first and second drive lines

(56) References Cited

U.S. PATENT DOCUMENTS

| | | | |
|---|---|---|---|
| 10,650,323 | B2 | 5/2020 | Epstein et al. |
| 10,924,095 | B1 | 2/2021 | Mckay et al. |
| 11,223,347 | B1* | 1/2022 | Mckay .................. H03K 5/01 |
| 11,244,241 | B1* | 2/2022 | Gambetta ............. G06N 10/00 |
| 2010/0182039 | A1 | 6/2010 | Baumgardner et al. |
| 2010/0194466 | A1 | 8/2010 | Yorozu et al. |
| 2018/0225586 | A1 | 8/2018 | Chow et al. |
| 2018/0260731 | A1 | 9/2018 | Zeng et al. |
| 2019/0228331 | A1 | 7/2019 | Harris et al. |
| 2019/0385088 | A1 | 12/2019 | Naaman et al. |
| 2022/0094358 | A1* | 3/2022 | Phung .................. G06F 30/394 |
| 2022/0108200 | A1* | 4/2022 | Suttle .................... G06N 10/00 |

FOREIGN PATENT DOCUMENTS

| | | |
|---|---|---|
| TW | 201945962 A | 12/2019 |
| TW | 202103339 A | 1/2021 |
| TW | 202111614 A | 3/2021 |
| WO | 2019182729 | 9/2019 |

OTHER PUBLICATIONS

Magesan et al., "Effective Hamiltonian models of the cross-resonance gate," Phys. Rev. A 101, 052308 (2020), 16 pages.

Noguchi et al., "Fast parametric two-qubit gates with suppressed residual interaction using a parity-violated superconducting qubit," arXiv:2005.02630v2 [quant-ph], May 7, 2020, 15 pages.

Li et al., "Entanglement of superconducting qubits via microwave fields: classical and quantum regimes," Phys. Rev B 78, 064503 (2008), Dec. 15, 2008, 18 pages.

Mundada et al., "Suppression of Qubit Crosstalk in a Tunable Coupling Superconducting Circuit," arXiv:1810.04182v2 [quant-ph], Jun. 3, 2019, 11 pages.

"IBM Quantum Experience," https://quantumexperience.ng.bluemix.net, 2 pages.

U.S. Appl. No. 17/135,295, filed Dec. 28, 2020.

International Search Report and Written Opinion for International Application No. PCT/EP2022/063360 dated Sep. 23, 2022.

Haonan Xiong et al: "Arbitrary controlled-phase gate on fluxonium qubits using differential ac-Stark shifts", arxiv.org, Cornell University Library, 201 Olin Library Cornell University Ithaca, NY 14853, Mar. 8, 2021 (Mar. 8, 2021), XP081907450, p. 1-p. 6, figures 1, 2 Supplementary Figure 1.

Noguchi Atsushi et al: "Fast parametric two-qubit gates with suppressed residual interaction using a parity-violated superconducting qubit", May 7, 2020 (May 7, 2020), pp. 1-15, XP055958870, arXiv.org, Retrieved from the Internet:, URL:https://arxiv.org/pdf/2005.02630.pdf, [retrieved on Sep. 8, 2022], p. 1- p. 2, figures 1, 2.

Office Action received for Taiwanese Patent Application Serial No. TW111110726 dated Jan. 9, 2023, 9 pages.

* cited by examiner

DRIVE ENHANCED J/ZZ OPERATION FOR SUPERCONDUCTING QUBITS

BACKGROUND

The subject disclosure relates to quantum computing, and more specifically, to systems, devices, computer-implemented methods, and/or computer program products that facilitate dynamic control of ZZ interactions for quantum computing devices.

Quantum computing devices can be composed of various arrangements of superconducting qubits. In various instances, the qubits can have fixed operational frequencies (e.g., a transmon qubit with a single Josephson junction can have a fixed operational frequency) and can be arranged in two-dimensional arrays on any suitable quantum computing substrate. In various aspects, any qubit in such a two-dimensional array can be coupled to some and/or all of its nearest-neighbor qubits and/or to some and/or all of its next-nearest neighbor qubits. Various techniques and/or systems exist for implementing or building two-qubit gates by driving qubits with microwave tones or signals at a frequency of one or more neighboring qubits. Two-qubit gates implemented using such microwave drive tones can exhibit high coherence and/or strong ZX interaction from cross resonance, which can improve the performance and/or functioning of the quantum computing device.

A number of two-qubit gates implemented using microwave drive tones, including cross-resonance, can have entanglement rates that can be proportional to an exchange coupling strength J between coupled qubits. As such, increasing the exchange coupling strength J can increase the speed of such two-qubit gates. However, increasing the exchange coupling strength J can also increase a known source of idle gate error and multi-qubit circuit infidelity—an always-on, spurious ZZ interaction between the coupled qubits. A competition can therefore exist between obtaining a desired exchange coupling strength J and an always-on, spurious ZZ interaction between the coupled qubits, which can degrade circuit performance.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, devices, computer-implemented methods, and/or computer program products that facilitate dynamic control of ZZ interactions for quantum computing devices are described.

According to an embodiment, a quantum device can comprise a biasing component that is operatively coupled to first and second qubits via respective first and second drive lines. The biasing component can facilitate dynamic control of ZZ interactions between the first and second qubits using continuous wave (CW) tones applied via the respective first and second drive lines. One aspect of such a quantum device is that the quantum device can facilitate dynamic control of ZZ interactions.

According to another embodiment, a computer-implemented method can comprise operatively coupling, by a system operatively coupled to a processor, a biasing component to first and second qubits via respective first and second drive lines. The computer-implemented method can further comprise using, by the system, the biasing component to dynamically control ZZ interactions between the first and second qubits with CW tones applied via the respective first and second drive lines. One aspect of such a computer-implemented method is that the computer-implemented method can facilitate dynamic control of ZZ interactions for quantum devices.

According to another embodiment, a computer program product can comprise a computer readable storage medium having program instructions embodied therewith. The program instructions are executable by a processor to cause the processor to perform operations. The operations can include operatively coupling, by the processor, a biasing component to first and second qubits via respective first and second drive lines. The operations can further include using, by the processor, the biasing component to facilitate dynamic control of ZZ interactions between the first and second qubits with CW tones applied via the respective first and second drive lines. One aspect of such a computer program product is that the computer program product can facilitate dynamic control of ZZ interactions for quantum devices.

According to another embodiment, a quantum device can comprise a biasing component that is operatively coupled to first and second qubits via respective first and second drive lines. The biasing component can facilitate dynamic control of ZZ interactions between the first and second qubits by dynamically adjusting a relative phase difference between CW tones applied via the respective first and second drive lines. One aspect of such a quantum device is that the quantum device can facilitate dynamic control of ZZ interactions.

According to another embodiment, a quantum device can comprise a biasing component that is operatively coupled to first and second qubits via respective first and second drive lines. The biasing component can facilitate dynamic control of ZZ interactions between the first and second qubits by dynamically adjusting a first amplitude of a first CW tone applied via the first drive line, dynamically adjusting a second amplitude of a second CW tone applied via the second drive line, or a combination thereof. One aspect of such a quantum device is that the quantum device can facilitate dynamic control of ZZ interactions.

DETAILED DESCRIPTION

Figure 1:
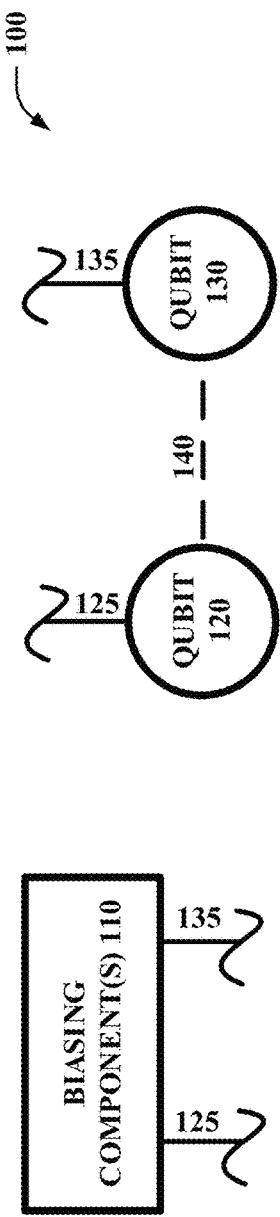
FIG. 1 illustrates a block diagram of an example, non-limiting device that can facilitate dynamic control of ZZ interactions for quantum computing devices, in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

The following definitions are used throughout the present disclosure, unless specifically indicated otherwise. "CR" denotes a cross-resonance gate. "CW" denotes continuous wave (e.g., always on). "Anharmonicity" ($\alpha$) denotes a difference between the second and first excited state energy levels and the qubit transition (e.g., the lowest two energy levels). "On-resonance" refers to when a drive field is at the same frequency as a transition frequency in the quantum system. "Hamiltonian" denotes an energy of the quantum system expressed in terms of quantum operators. "Stark shift" denotes a shift in the energy levels of a quantum system due to an off-resonance drive field. "Stark drive" denotes an off-resonant drive that causes an ac Stark shift. "ZZ" denotes the shift in energy of the state when two qubits are excited. "Gate" denotes an operation on the quantum system that transforms the quantum state. "Single-qubit gate" denotes a gate that transforms the state of a single qubit (e.g., typically with a microwave drive). "Two-qubit gate" denotes a gate that transforms the joint state of two qubits, which involves some form of interaction between the two qubits.

Classical computers operate on binary digits (or bits) that store or represent information as binary states to perform computing and information processing functions. In contrast, quantum computing devices operate on quantum bits (or qubits) that store or represent information as both the binary states and superpositions of the binary states. To that end, quantum computing devices utilize quantum-mechanical phenomena, such as entanglement and interference.

A quantum computation uses a qubit as its essential unit instead of a classical computing bit. The qubit (e.g., quantum binary digit) is the quantum-mechanical analog of the classical bit. Whereas classical bits can employ on only one of two basis states (e.g., 0 or 1), qubits can employ on superpositions of those basis states (e.g., $\alpha|0\rangle+\beta|1\rangle$, where $\alpha$ and $\beta$ are complex scalars such that $|\alpha|^2+|\beta|^2=1$), allowing a number of qubits to theoretically hold exponentially more information than a same number of classical bits. Thus, quantum computers (e.g., computers that employ qubits instead of solely classical bits) can, in theory, quickly solve problems that can be extremely difficult for classical computers. The bits of a classical computer are simply binary digits, with a value of either 0 or 1. Almost any device with two distinct states can serve to represent a classical bit: a switch, a valve, a magnet, a coin, etc. Qubits, operating under the principles of quantum mechanics, can occupy a superposition of 0 and 1 states, as described above with the complex scalars $\alpha$ and $\beta$. However, when the state of the qubit is measured, the result is either 0 or 1. But in the course of a computation, a qubit evolves in the superposition state and there can be interference effects between these complex coefficients. This is very distinct from strictly classical probabilistic computing. General quantum programs require coordination of quantum and classical parts of a computation. One way to think about general quantum programs is to identify processes and abstractions involved in specifying a quantum algorithm, transforming the algorithm into executable form, running an experiment or simulation, and analyzing the results. By processing information using laws of quantum mechanics, quantum computers offer novel ways to perform computation tasks such as molecular calculations, financial risk calculations, optimization and many more.

One common type of quantum circuit implemented in quantum computing devices comprise fixed frequency transmon qubits with fixed coupling. Transmons can be viewed as leading candidates toward creating quantum bits (or qubits) for advancing scalability of quantum computing devices. Each qubit of such quantum circuits can have a microwave drive line that operatively couples that qubit to a biasing component. In an embodiment, a Hamiltonian of such quantum circuits can be approximated using the Hamiltonian defined by Equation 1:

$$H = \sum_{i=\{0,1\}} \left[ \begin{array}{c} \omega_i \hat{n}_i + \frac{1}{2}\alpha_i \hat{n}_i(\hat{n}_i - 1) + \\ \Omega_{d,i}\cos(\omega_{d,i}t + \phi_{d,i})(\hat{a}_i^\dagger + \hat{a}_i) \end{array} \right] + J(\hat{a}_0^\dagger + \hat{a}_0)(\hat{a}_1^\dagger + \hat{a}_1). \quad \text{Equation 1}$$

In accordance with Equation 1 above, $\omega_i$ denotes the qubit frequency for transmon i (e.g., the energy splitting between the lowest two levels), $\alpha_i$ denotes the anharmonicity for transmon i (e.g., the difference between the energy splitting between the first and second energy levels and $\omega_i$), $\hat{n}_i$ denotes the number operator for transmon i, $\Omega_{d,i}$ denotes the microwave drive strength on transmon i, $\phi_{d,i}$ denotes the drive phase on qubit i, $\hat{\alpha}_i^\dagger$ denotes the creation operator for transmon i, $\hat{\alpha}_i$ denotes the annihilation operator for qubit i, $\omega_{d,i}$ denotes the microwave drive frequency on transmon i, J is the exchange coupling between the qubits, and t denotes time. In an embodiment, Equation 1 can be a duffing oscillator approximation. The Hamiltonian defined by Equation 1 includes a qubit frequency term, an anharmonicity term, a drive term, and a coupling term that relates to a coupling between qubits. In Equation 1, the qubit frequency term corresponds to $\omega_i \hat{n}_i$, the anharmonicity term corresponds to $\frac{1}{2}\alpha_i \hat{n}_i(\overline{n}_i-1)$, the drive term corresponds to $\Omega_{d,i} \cos(\omega_{d,i}t \phi_{d,i})$, and the coupling term corresponds to $J(\hat{\alpha}_0^\dagger + \hat{\alpha}_0)(\hat{\alpha}_1^\dagger + \hat{\alpha}_1)$.

In some instances, application of an "on-resonance" drive signal (e.g., $\omega_{d,i}=\omega_i$) can facilitate single-qubit gates. That is, applying an "on-resonance" drive signal can facilitate manipulating a state of a particular qubit. For example, the particular qubit can modulate between a |0⟩ ground state and a |1⟩ excited state. In some instances, cross-resonance can be performed by applying a drive signal that is resonant with a neighboring qubit. For example, cross-resonance can be performed if $\omega_{d,0}=\omega_1$ or vice-versa. Performing such cross-resonance can facilitate an all-microwave method for performing two-qubit gates.

One aspect of the form of the fixed coupling Hamiltonian defined by Equation 1 is that in the "dressed frame" (e.g., the frame after diagonalizing the Hamiltonian to account for the coupling term), there can be residual unwanted ZZ coupling. In an embodiment, the residual unwanted ZZ coupling can be approximated using the expression defined by Equation 2:

$$ZZ = 2J^2\left(\frac{1}{\omega_0 - \omega_1 + \alpha_0} + \frac{1}{\omega_1 - \omega_0 + \alpha_1}\right). \qquad \text{Equation 2}$$

A number of microwave-only two-qubit gates, including cross-resonance, can have entanglement rates that can be proportional to J, the exchange coupling between qubits. Therefore, increasing J can speed up a two-qubit gate. However, increasing J can also lead to increasing ZZ, which is a known source of idle error and multi-qubit circuit infidelity. This competition between two-qubit gate speed and spurious crosstalk can be remedied by sophisticated coupling schemes that can utilize multiple coupling paths for engineering energy shifts that can lead to cancellation of ZZ while maintaining a relatively sizeable J coupling strength. However, in a fixed frequency architecture, enhancements in the J/ZZ ratio can be sensitive to placement of qubit frequencies in the straddling regime.

In some instances, a CW drive near-resonant to side band transitions can be used to cancel ZZ. Moreover, drives can be used simultaneously at the same frequency on a pair of coupled qubits to drive a Stark induced ZZ gate. In an embodiment, a three-level model of a transmon, excluding counter rotating terms in the coupling Hamiltonian, can be approximated in a high-power limit using the expression defined by Equation 3:

$$\tilde{v}_{ZZ} \approx \tilde{v}_{ZZ,s} + \frac{J\alpha_0\alpha_1\Omega_0\Omega_1\cos(\phi_0-\phi_1)}{\Delta_{0,d}\Delta_{1,d}(\alpha_0 + \Delta_{0,d})(\alpha_1 + \Delta_{1,d})}. \qquad \text{Equation 3}$$

In accordance with Equation 3 above, $\tilde{v}_{ZZ,s}$ denotes the static ZZ interaction term given by Equation 2, $\alpha_i$ denotes the anharmonicity of the $i^{th}$ qubit (as in Equation 1), $\Omega_i$ denotes the Stark drive strength applied to qubit i, $\phi_i$ denotes the Stark phase of the drive applied to qubit i, and $\Delta_{i,d}$ denotes a difference between a frequency of an off-resonance drive tone and an operational frequency of qubit i.

Equation 3 shows that a ZZ activation and/or cancellation by Stark can be effectively set by a ratio of the drive power to detuning. Equation 3 further shows that the Stark can be a function of the relative phase between the drive tones and can also be proportional to J, the exchange coupling between qubits. Equation 3 also shows that ZZ cancellation can be achieved for a wide range of operating parameters (e.g., frequency, drive amplitude, and/or phase difference) that satisfy the relationship defined by Equation 4:

$$\Omega_1\Omega_2 = -\frac{\tilde{v}_{ZZ,s}\Delta_{1,d}\Delta_{2,d}(\alpha_1 + \Delta_{1,d})(\alpha_2 + \Delta_{2,d})}{J\alpha_1\alpha_2\cos(\phi_1 - \phi_2)}. \qquad \text{Equation 4}$$

Unlike instances in which a CW drive near-resonant to sideband transitions are used to cancel ZZ, dual driving can facilitate a wide range of frequencies and generally does not involve driving near-resonant to sideband transitions. Furthermore, dual driving can introduce an additional parameter to facilitate ZZ cancellation—a phase difference.

FIG. 1 illustrates a block diagram of an example, non-limiting quantum device 100 that can facilitate dynamic control of ZZ interactions for quantum computing devices, in accordance with one or more embodiments described herein. As illustrated by the example embodiment depicted in FIG. 1, quantum device 100 includes a biasing component 110, a first qubit 120, and a second qubit 130. First qubit 120 and second qubit 130 can be operatively coupled to biasing component 110 via first drive line 125 and second drive line 135, respectively. Examples of qubits that are suitable for implementing first qubit 120 and/or second qubit 130 include, but are not limited to: a fixed frequency qubit, a tunable qubit, a transmon qubit, a fixed frequency transmon qubit, a tunable transmon qubit, and the like. In an embodiment, first qubit 120 and/or second qubit 130 can be fixed-frequency, non-tunable qubits. As described in greater detail below, biasing component 110 can facilitate dynamic control of ZZ interactions between qubits (e.g., first qubit 120 and/or second qubit 130) using continuous wave (CW) tones applied via respective drive lines (e.g., first drive line 125 and/or second drive line 135). By modifying aspects of such CW tones, embodiments of biasing component 110 can provide tunable coupling 140 between first qubit 120 and second qubit 130.

Figure 2:
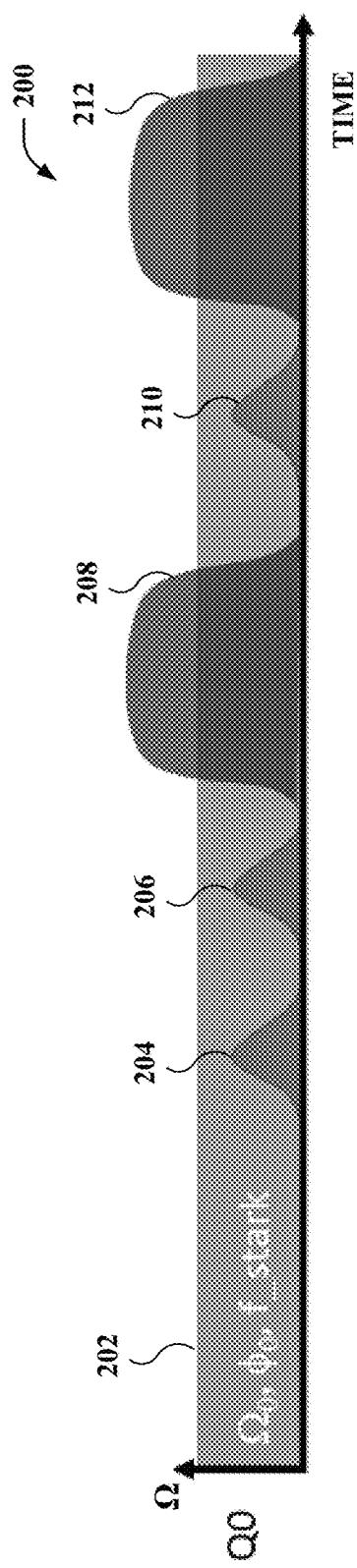
FIG. 2 illustrates example, non-limiting qubit drive tones (or drive signals), in accordance with one or more embodiments described herein.
Figure 2:
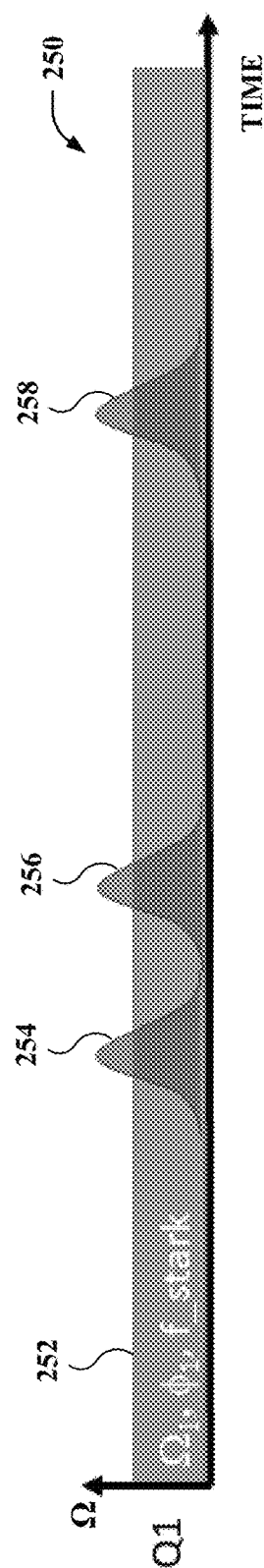

FIG. 2 illustrates example, non-limiting qubit drive tones (or drive signals), in accordance with one or more embodiments described herein. In particular, FIG. 2 illustrates graphs 200 and 250 that depict example, non-limiting drive tones that biasing component 110 can apply to first qubit 120 and second qubit 130, respectively, via corresponding drive lines. In an embodiment, the drive tones that biasing component 110 applies can be microwave drive tones. A Y-axis (e.g., the vertical axis of graph 200) of each graph depicted in FIG. 2 represents drive amplitude (or drive strength) and an X-axis (e.g., the horizontal axis of graph 200) of each graph depicted in FIG. 2 represents time.

As shown by FIG. 2, biasing component 110 can apply single-qubit pulse tones (e.g., single-qubit pulse tones 204, 206, 210, 254, 256, and/or 258) to first qubit 120 and/or second qubit 130 via drive first drive line 125 and second drive line 135, respectively. Application of the single-qubit pulse tones can induce single-qubit gate operations on first qubit 120 and/or second qubit 130. FIG. 2 further shows that biasing component 110 can apply two-qubit entangling pulse tones (e.g., two-qubit entangling pulse tones 208 and/or 212) to one qubit among first qubit 120 and second qubit 130 via a corresponding drive line. Application of a two-qubit entangling pulse tone to one qubit among first qubit 120 and second qubit 130 can induce a two-qubit gate operation (e.g., a CNOT gate via cross resonance) between first qubit 120 and second qubit 130.

Biasing component 110 can also apply CW tones to first qubit 120 and second qubit 130 via corresponding drive lines. For example, biasing component 110 can apply CW tone 202 and CW tone 252 to first qubit 120 and second qubit 130, respectively. CW tone 202 comprises a first frequency (e.g., f_stark), a first drive amplitude $\Omega_0$, and a first drive phase $\phi_0$. CW tone 252 comprises a second frequency (e.g., f_stark), a second drive amplitude $\Omega_1$, and a second drive phase $\phi_1$. In the example of FIG. 2, CW tone 202 and CW tone 252 can comprise a common frequency (e.g., f_stark). That is, the first frequency of CW tone 202 and the second frequency of CW tone 252 can be substantially similar. In an embodiment, the common frequency can be defined using a frequency that is off-resonant from respective transitions of first qubit 120 and/or second qubit 130. As discussed in greater detail below, biasing component 110 can utilize CW tones (e.g., CW tone 202 and/or CW tone 252) to facilitate dynamic control of ZZ interactions between qubits. That is, biasing component 110 can utilize such CW tones to facilitate tunable ZZ interaction between qubits.

In an embodiment, biasing component 110 can facilitate dynamic control of ZZ interactions between first qubit 120 and second qubit 130 by dynamically adjusting (or controlling) a relative phase difference between CW tone 202 and/or CW tone 252. In this embodiment, biasing component 110 can dynamically adjust first drive phase $\phi_0$ and/or second drive phase $\phi_1$ such that a phase difference between first drive phase $\phi_0$ and second drive phase $\phi_1$ changes. For example, CW tone 202 and CW tone 252 can have a phase difference of $\pi/2$ radians. In this example, biasing component 110 can facilitate dynamic control of ZZ interactions between first qubit 120 and second qubit 130 by dynamically adjusting first drive phase $\phi_0$ and/or second drive phase $\phi_1$ such that the phase difference between CW tone 202 and CW tone 252 changes from $\pi/2$ radians to another phase difference (e.g., $\pi$ radians). By dynamically adjusting the relative phase difference between CW tone 202 and CW tone 252, biasing component 110 can cancel, mitigate, or substantially reduce a static ZZ interaction between first qubit 120 and second qubit 130.

In an embodiment, biasing component 110 can facilitate dynamic control of ZZ interactions between first qubit 120 and second qubit 130 by calibrating (or tuning) a ZZ interaction between first qubit 120 and second qubit 130 during a two-qubit gate operation. For example, biasing component 110 can dynamically adjust (or control) a relative phase difference between CW tone 202 and CW tone 252 during application of a two-qubit entangling pulse tone to one qubit among first qubit 120 and second qubit 130. In this example, biasing component 110 can additionally or alternatively adjust at least one amplitude among first drive amplitude $\Omega_0$ and second drive amplitude $\Omega_1$ during application of the two-qubit entangling pulse tone.

One skilled in the art will appreciate that two-qubit entangling pulse tones (e.g., cross-resonance pulse tones) can generate ZZ interaction terms during a corresponding two-qubit gate operation that are external to static ZZ interaction terms. Such ZZ interaction terms generated during two-qubit gate operations can be referred to as dynamic ZZ interaction. By dynamically calibrating a ZZ interaction (e.g., a static ZZ interaction) between first qubit 120 and second qubit 130, biasing component 110 can facilitate cancelling, mitigating, or substantially reducing a net ZZ interaction during the two-qubit gate operation. In an embodiment, the net ZZ interaction can have a magnitude based on an exchange coupling strength J between first qubit 120 and second qubit 130 during the two-qubit gate operation.

Figure 3:
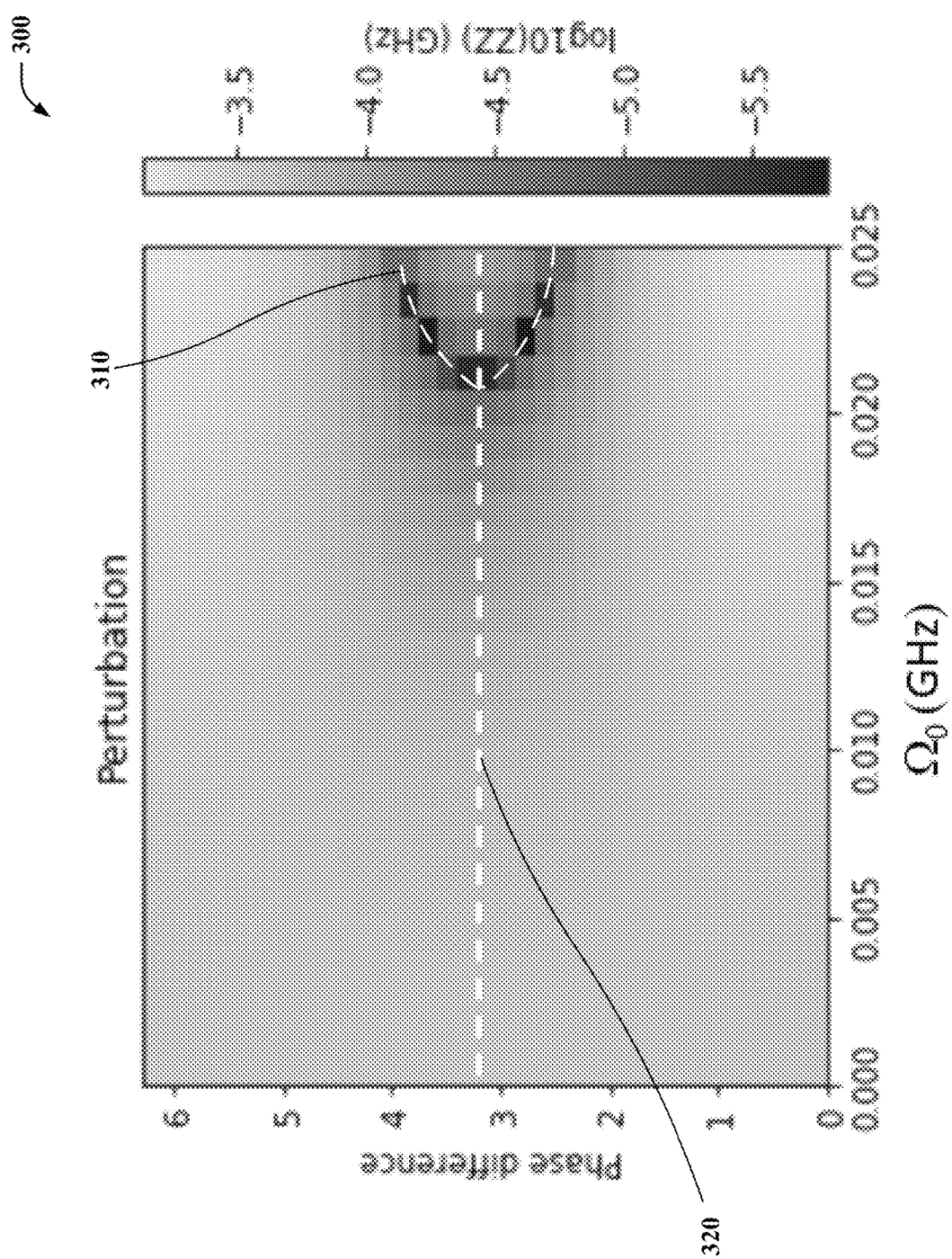
FIG. 3 illustrates an example, non-limiting graph depicting ZZ interaction strength versus a relative phase difference between CW tones and a first qubit CW tone drive strength (or amplitude), in accordance with one or more embodiments described herein.
Figure 4:
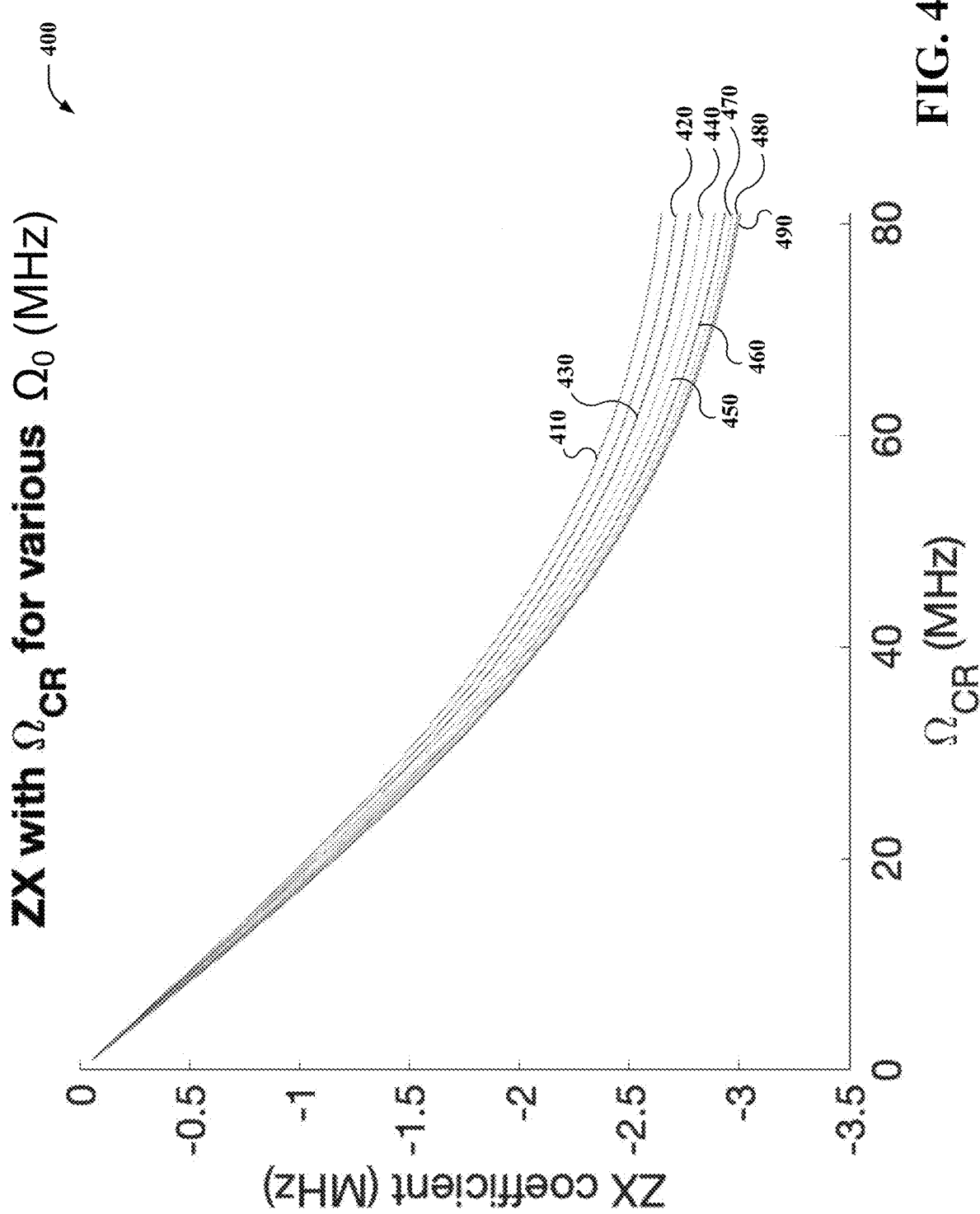
FIG. 4 illustrates an example, non-limiting graph depicting ZX rate as a function of cross-resonance drive strength (or amplitude), for different CW tone amplitudes, in accordance with one or more embodiments described herein.

FIGS. 3-4 illustrate an embodiment in which biasing component 110 can facilitate dynamic control of ZZ interactions between first qubit 120 and second qubit 130 using CW tone 202 and CW tone 252. In the embodiment illustrated by FIGS. 3-4, first qubit 120 and second qubit 130 can have resonant frequencies of approximately 4841 megahertz (MHz) and 4964 MHz, respectively. CW tone 202 and CW tone 252 can have a common frequency that can be defined using a frequency that is off-resonant from respective transitions of first qubit 120 or second qubit 130. In this embodiment, CW tone 202 and CW tone 252 can have a common frequency of 5000 MHz. In FIGS. 3-4, first qubit 120 and second qubit 130 can each also have a qubit anharmonicity of −300 MHz and an exchange coupling strength J of 4.4 MHz.

A Y-axis of graph 300 (e.g., the vertical axis of graph 300) represents a relative phase difference between CW tone 202 and CW tone 252 and an X-axis of graph 300 (e.g., the horizontal axis of graph 300) represents a first drive amplitude $\Omega_0$ of CW tone 202. that biasing component 110 applies to first qubit 120 and second qubit 130. As illustrated by graph 300, static ZZ interactions between first qubit 120 and second qubit 130 can vary based on a relative phase difference between CW tone 202 and CW tone 252 consistent with Equations 3 and 4. For example, graph 300 includes a low ZZ static interaction region 310 at which static ZZ interactions between first qubit 120 and second qubit 130 can be substantially zero. Graph 300 shows that the low ZZ static interaction region 310 is approximately centered about a line 320 corresponding to the relative phase difference between CW tone 202 and CW tone 252 of approximately $\pi$ radians. As such, biasing component 110 can facilitate canceling, mitigating, or substantially reducing static ZZ interactions between first qubit 120 and second qubit 130 by dynamically adjusting the relative phase difference between CW tone 202 and CW tone 252 to approximately $\pi$ radians. In an embodiment, the first drive amplitude $\Omega_0$ of CW tone 202 and the second drive amplitude $\Omega_1$ of CW tone 252 can remain constant when (or while) biasing component 110 dynamically adjusts the relative phase difference.

Graph 300 further shows that, consistent with Equations 3 and 4, static ZZ interactions between first qubit 120 and second qubit 130 can also vary based on the first drive amplitude $\Omega_0$ of CW tone 202 (or the second drive amplitude $\Omega_1$ of CW tone 252 to the extent that biasing component maintains a constant ratio of approximately 1.24 between the first drive amplitude $\Omega_0$ of CW tone 202 and the second drive amplitude $\Omega_1$ of CW tone 252 in this embodiment). For example, the low ZZ static interation region 310 of graph 300 corresponds with various values of first drive amplitude $\Omega_0$ of CW tone 202. As such, biasing component 110 can also facilitate canceling, mitigating, or substantially reducing static ZZ interactions between first qubit 120 and second qubit 130 by dynamically adjusting the first drive amplitude $\Omega_0$ of CW tone 202 and/or the second drive amplitude $\Omega_1$ of CW tone 252. In an embodiment, the relative phase difference between CW tone 202 and CW tone 252 can remain constant when (or while) biasing component 110 dynamically adjusts the first drive amplitude $\Omega_0$ of CW tone 202 and/or the second drive amplitude $\Omega_1$ of CW tone 252.

FIG. 4 illustrates an example, non-limiting graph 400 depicting ZX rate as a function of cross-resonance drive strength (or amplitude), in accordance with one or more embodiments described herein. As illustrated by graph 400, a relatively fast ZX rate via cross-resonance can be realized in addition to the exchange coupling strength J of 4.4 MHz as biasing component 110 facilitates such cancelation or substantial reduction in static interaction between first qubit 120 and second qubit 130. In particular, graph 400 depicts ZX rates that can be realized when biasing component 110 dynamically adjusts the relative phase difference between CW tone 202 and CW tone 252 to $\pi$ radians for various values of first drive amplitude $\Omega_0$. For example, line 410 corresponds to a first drive amplitude $\Omega_0$ of 25 MHz, line 420 corresponds to a first drive amplitude $\Omega_0$ of 22 MHz, line 430 corresponds to a first drive amplitude $\Omega_0$ of 19 MHz, line 440 corresponds to a first drive amplitude $\Omega_0$ of 16 MHz, line 450 corresponds to a first drive amplitude $\Omega_0$ of 13 MHz, line 460 corresponds to a first drive amplitude $\Omega_0$ of 10 MHz, line 470 corresponds to a first drive amplitude $\Omega_0$ of 7 MHz, line 480 corresponds to a first drive amplitude $\Omega_0$ of 4 MHz, and line 490 corresponds to a first drive amplitude $\Omega_0$ of 1 MHz.

Figure 5:
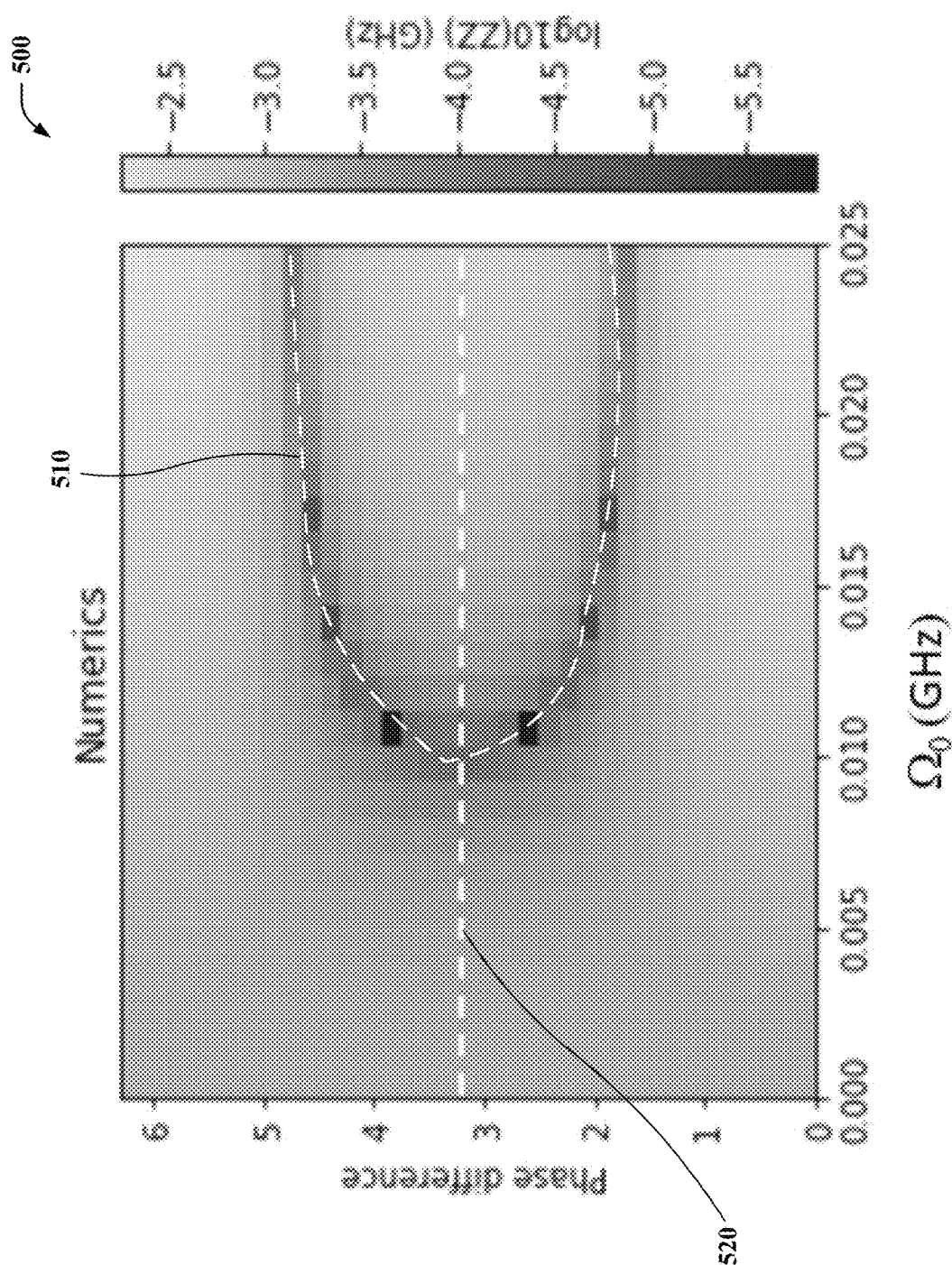
FIG. 5 illustrates another example, non-limiting graph depicting ZZ interaction strength versus a relative phase difference between CW tones and first qubit CW tone amplitude, in accordance with one or more embodiments described herein.
Figure 6:
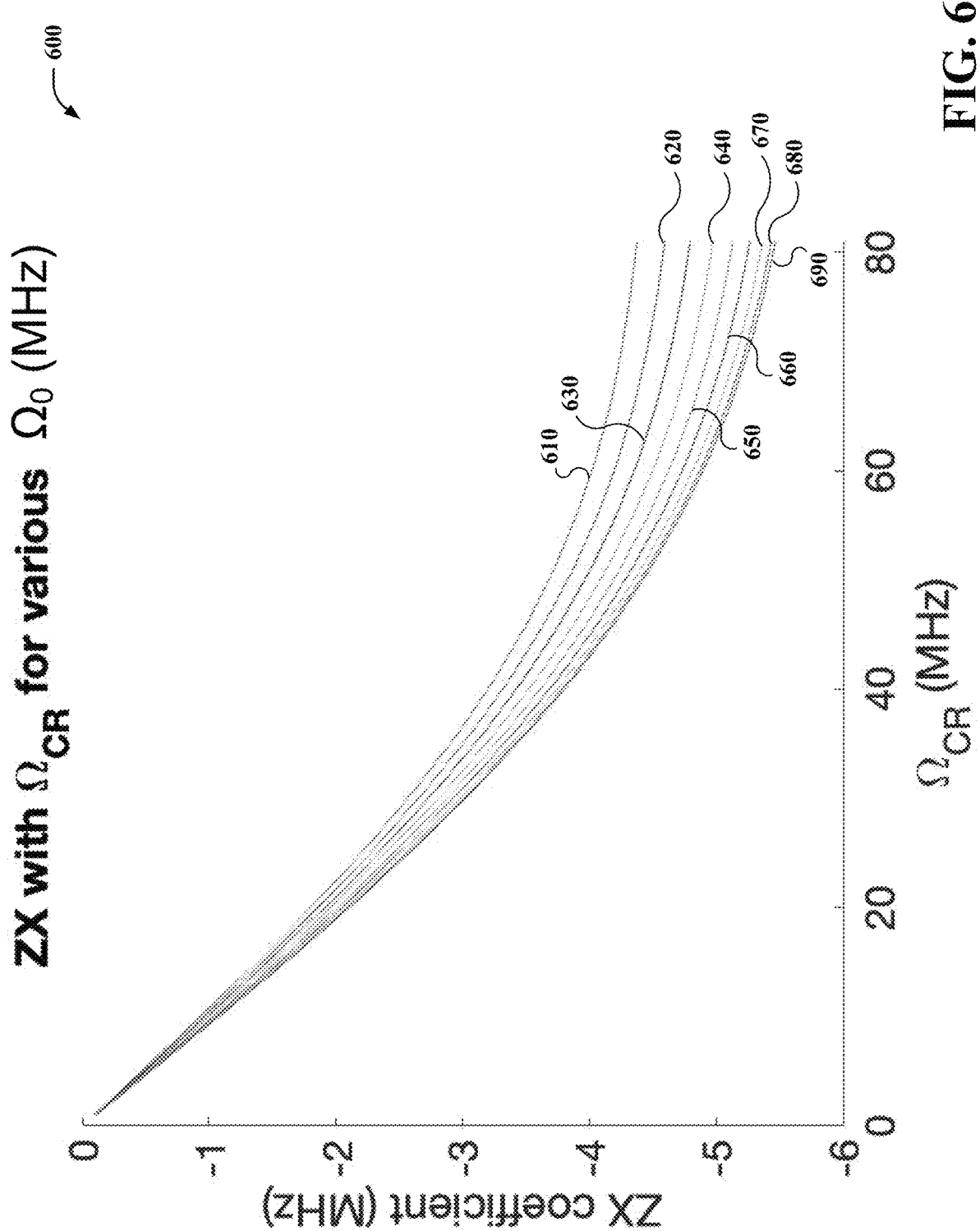
FIG. 6 illustrates another example, non-limiting graph depicting ZX rate as a function of cross-resonance drive strength, for different CW tone amplitudes, in accordance with one or more embodiments described herein.
Figure 7:
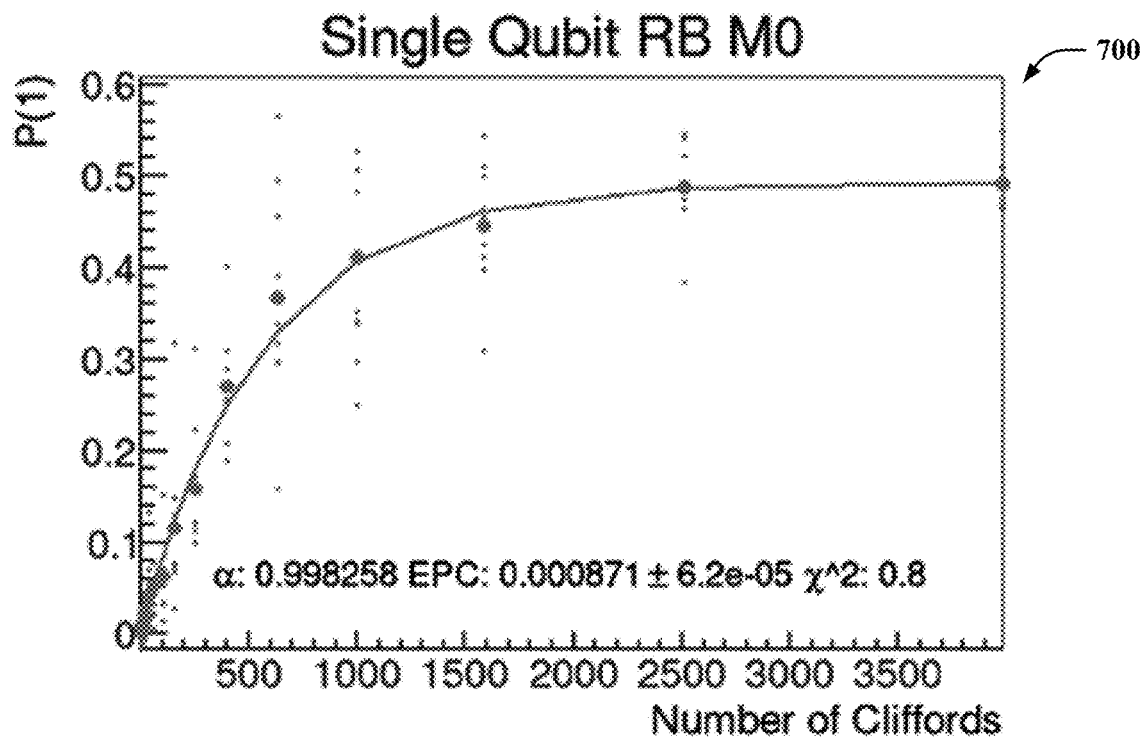
FIGS. 7-10 illustrate example, non-limiting graphs that depict static ZZ interaction reduction facilitated by CW tones during single qubit gate operations, in accordance with one or more embodiments described herein.
Figure 8:
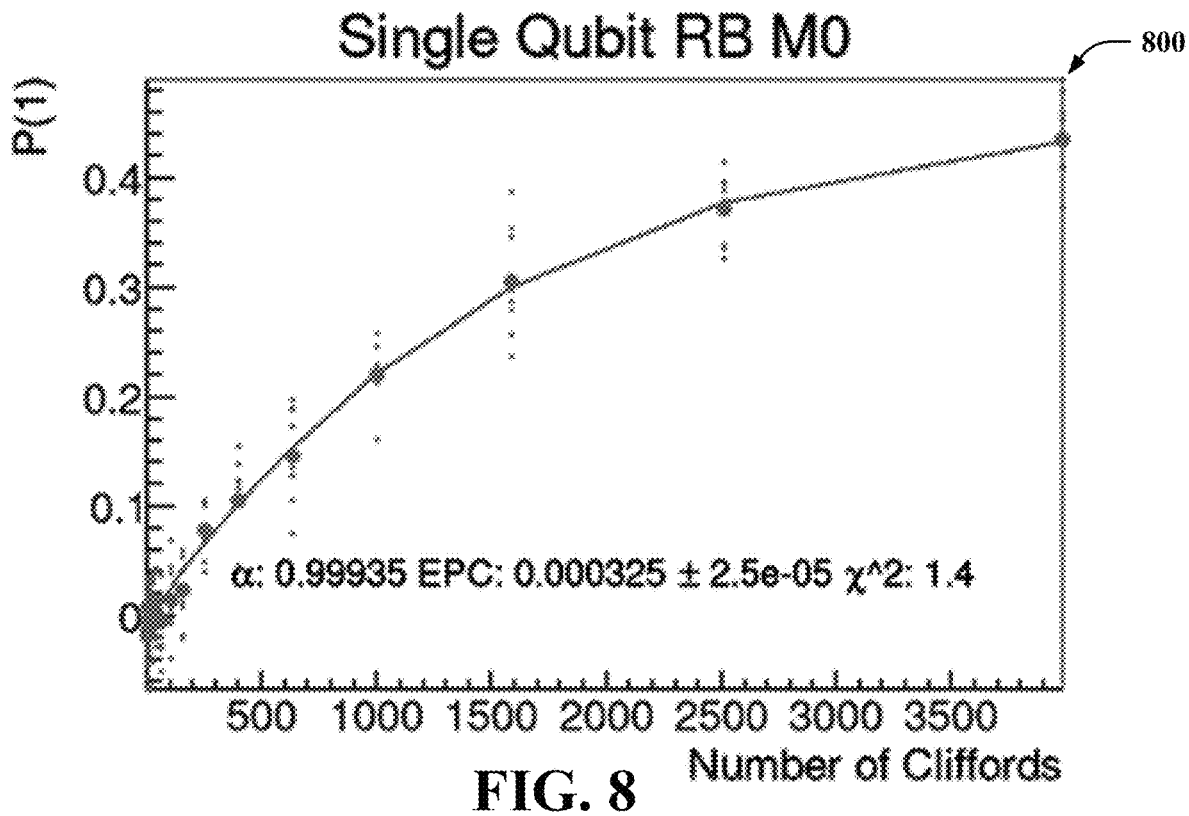

FIGS. 5-6 illustrate another embodiment in which biasing component 110 can facilitate dynamic control of ZZ interactions between first qubit 120 and second qubit 130 using CW tone 202 and CW tone 252. In the embodiment illustrated by FIGS. 5-6, the respective resonant frequencies and qubit anharmonicities of first qubit 120 and second qubit 130 can remain unchanged from the embodiment illustrated by FIGS. 3-4. Moreover, the respective frequencies of CW tone 202 and CW tone 252 can remain 5000 MHz. In FIGS. 5-6, first qubit 120 and second qubit 130 can have an exchange coupling strength J of 8 MHz.

A Y-axis of graph 500 (e.g., the vertical axis of graph 500) represents a relative phase difference between CW tone 202 and CW tone 252 and an X-axis of graph 500 (e.g., the horizontal axis of graph 300) represents a first drive amplitude $\Omega_0$ of CW tone 202. that biasing component 110 applies to first qubit 120 and second qubit 130. As illustrated by graph 300, static ZZ interactions between first qubit 120 and second qubit 130 can vary based on a relative phase difference between CW tone 202 and CW tone 252 consistent with Equations 3 and 4. For example, graph 500 includes a low ZZ static interaction region 510 at which static ZZ interactions between first qubit 120 and second qubit 130 can be substantially zero. Graph 500 shows that the low ZZ static interaction region 510 is approximately centered about a line 520 corresponding to the relative phase difference between CW tone 202 and CW tone 252 of approximately $\pi$ radians. As such, biasing component 110 can facilitate canceling, mitigating, or substantially reducing static ZZ interactions between first qubit 120 and second qubit 130 by dynamically adjusting the relative phase difference between CW tone 202 and CW tone 252 to approximately $\pi$ radians.

In an embodiment, the first drive amplitude $\Omega_0$ of CW tone 202 and the second drive amplitude $\Omega_1$ of CW tone 252 can remain constant when (or while) biasing component 110 dynamically adjusts the relative phase difference.

Graph 500 further shows that, consistent with Equations 3 and 4, static ZZ interactions between first qubit 120 and second qubit 130 can also vary based on the first drive amplitude $\Omega_0$ of CW tone 202 (or the second drive amplitude $\Omega_1$ of CW tone 252 to the extent that biasing component maintains a constant ratio of approximately 3 between the first drive amplitude $\Omega_0$ of CW tone 202 and the second drive amplitude $\Omega_1$ of CW tone 252 in this embodiment). For example, the low ZZ static interation region 510 of graph 500 corresponds with various values of first drive amplitude $\Omega_0$ of CW tone 202. As such, biasing component 110 can also facilitate canceling, mitigating, or substantially reducing static ZZ interactions between first qubit 120 and second qubit 130 by dynamically adjusting the first drive amplitude $\Omega_0$ of CW tone 202 and/or the second drive amplitude $\Omega_1$ of CW tone 252. In an embodiment, the relative phase difference between CW tone 202 and CW tone 252 can remain constant when (or while) biasing component 110 dynamically adjusts the first drive amplitude $\Omega_0$ of CW tone 202 and/or the second drive amplitude $\Omega_1$ of CW tone 252. Graph 500 further includes counter-rotating terms in the coupling Hamiltonian. In this example, the static ZZ interaction between first qubit 120 and second qubit 130 can exceed 1 MHz.

FIG. 6 illustrates an example, non-limiting graph 600 depicting ZX rate as a function of cross-resonance drive strength (or amplitude), in accordance with one or more embodiments described herein. As illustrated by graph 600, a relatively fast ZX rate via cross-resonance can be realized in addition to the exchange coupling strength J of 8 MHz as biasing component 110 facilitates such cancelation or substantial reduction in static ZZ interaction between first qubit 120 and second qubit 130. In particular, graph 600 depicts ZX rates that can be realized when biasing component 110 dynamically adjusts the relative phase difference between CW tone 202 and CW tone 252 to $\pi$ radians for various values of first drive amplitude $\Omega_0$. For example, line 610 corresponds to a first drive amplitude $\Omega_0$ of 25 MHz, line 620 corresponds to a first drive amplitude $\Omega_0$ of 22 MHz, line 630 corresponds to a first drive amplitude $\Omega_0$ of 19 MHz, line 640 corresponds to a first drive amplitude $\Omega_0$ of 16 MHz, line 650 corresponds to a first drive amplitude $\Omega_0$ of 13 MHz, line 660 corresponds to a first drive amplitude $\Omega_0$ of 10 MHz, line 670 corresponds to a first drive amplitude $\Omega_0$ of 7 MHz, line 680 corresponds to a first drive amplitude $\Omega_0$ of 4 MHz, and line 690 corresponds to a first drive amplitude $\Omega_0$ of 1 MHz.

Figure 9:
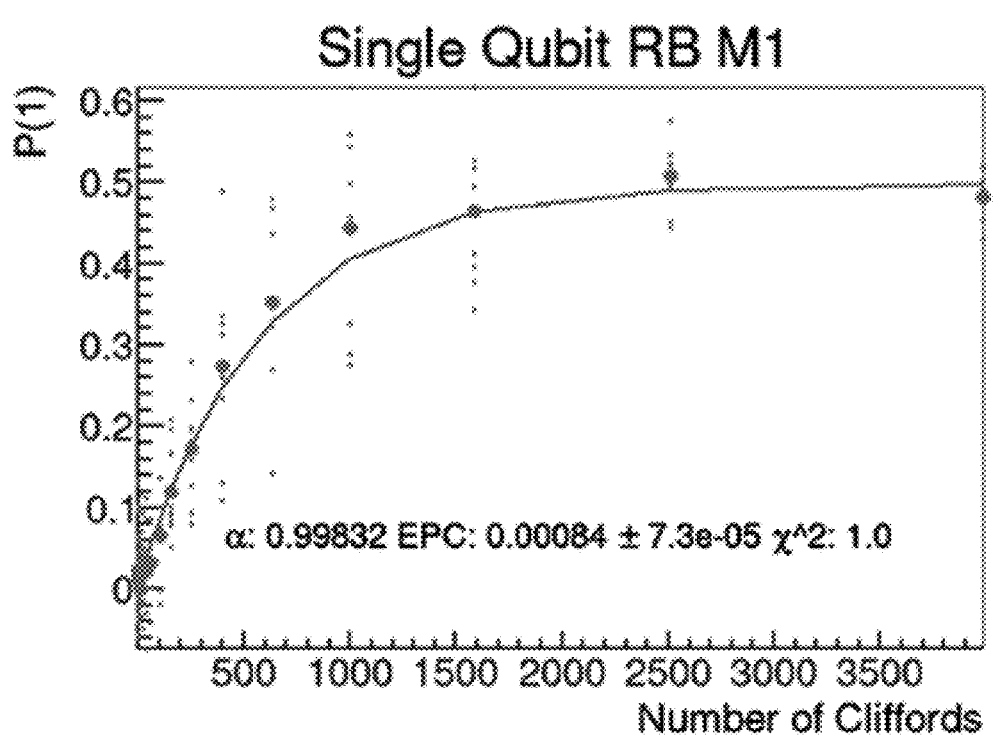
Figure 10:
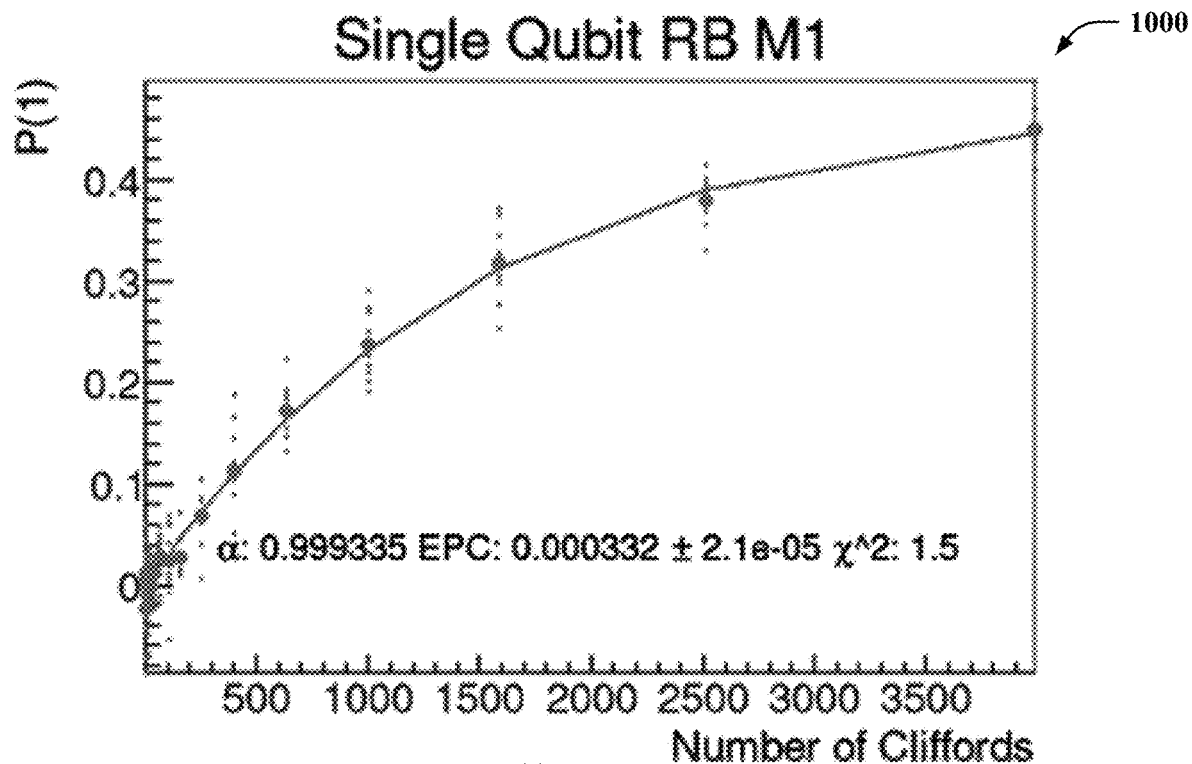

FIGS. 7-10 illustrate an example of static ZZ interaction reduction facilitated by CW tones during single-qubit randomized benchmarking (RB) runs, in accordance with one or more embodiments described herein. In particular, graph 700 of FIG. 7 and graph 900 of FIG. 9 illustrate results of simultaneous single-qubit RB runs executed on first qubit 120 and second qubit 130, respectively, without biasing component 110 using CW tones to facilitate control of ZZ static interactions. Graph 800 of FIG. 8 and graph 1000 of FIG. 10 illustrate results of simultaneous single-qubit RB runs executed on first qubit 120 and second qubit 130, respectively, with biasing component 110 using CW tones to facilitate control of ZZ static interactions. A Y-axis (e.g., the vertical axis of graph 700) of each graph depicted in FIGS. 7-10 represents a respective |1 ⟩ excited state population and an X-axis (e.g., the horizontal axis of graph 700)

of each graph depicted in FIGS. 7-10 represents a Clifford Length or a number of Cliffords. In an embodiment, the Y-axis of each graph depicted in FIGS. 7-10 can correspond to a unitless fraction. In this example, first qubit 120 and second qubit 130 can have resonant frequencies of 4963.9 MHz and 4841.3 MHz, respectively. In this example, first qubit 120 can have average T1 and T2 coherence times of 158.1 microsecond (μs) and 144.6 μs, respectively. In this example, second qubit 130 can have average T1 and T2 coherence times of 123.9 μs and 126.7 μs, respectively.

To execute the simultaneous single-qubit RB runs on first qubit 120 and second qubit 130, biasing component 110 can simultaneously apply single-qubit pulse tones via first drive line 125 and second drive line 135, respectively. That simultaneous application of single-qubit pulse tones can induce 72 nanosecond (ns) single-qubit gate operations on first qubit 120 and second qubit 130. In this example, first qubit 120 and second qubit 130 can have an exchange coupling strength J of approximately 4.4 MHz. Without biasing component 110 using CW tones to facilitate control of ZZ static interactions, a static ZZ interaction between first qubit 120 and second qubit 130 of approximately 312 kilohertz (kHz) can accompany that exchange coupling strength J of approximately 4.4 MHz. That static ZZ interaction of approximately 312 kHz can degrade circuit performance. For example, graphs 700 and 900 show that first qubit 120 and second qubit 130 each have an average error-rate or Error per Clifford (EPC) of approximately 0.08% without biasing component 110 using CW tones to facilitate control of ZZ static interactions.

With biasing component 110 using CW tones to facilitate control of ZZ static interactions, the exchange coupling strength J of approximately 4.4 MHz can be maintained between first qubit 120 and second qubit 130. However, the static ZZ interaction between first qubit 120 and second qubit 130 can be reduced from approximately 312 kHz to approximately 8 kHz with biasing component 110 using CW tones to facilitate control of ZZ static interactions. Such reduction in static interaction between first qubit 120 and second qubit 130 can facilitate an improvement in circuit performance. For example, graphs 800 and 1000 show that the average error-rate or EPC of first qubit 120 and second qubit 130 each improve from approximately 0.08% to approximately 0.03% with biasing component 110 using CW tones to facilitate control of ZZ static interactions. In this example, biasing component 110 can apply CW tones via first drive line 125 and second drive line 135 that each have a frequency of 5000 MHz while executing the simultaneous single-qubit RB runs on first qubit 120 and second qubit 130.

Figure 11:
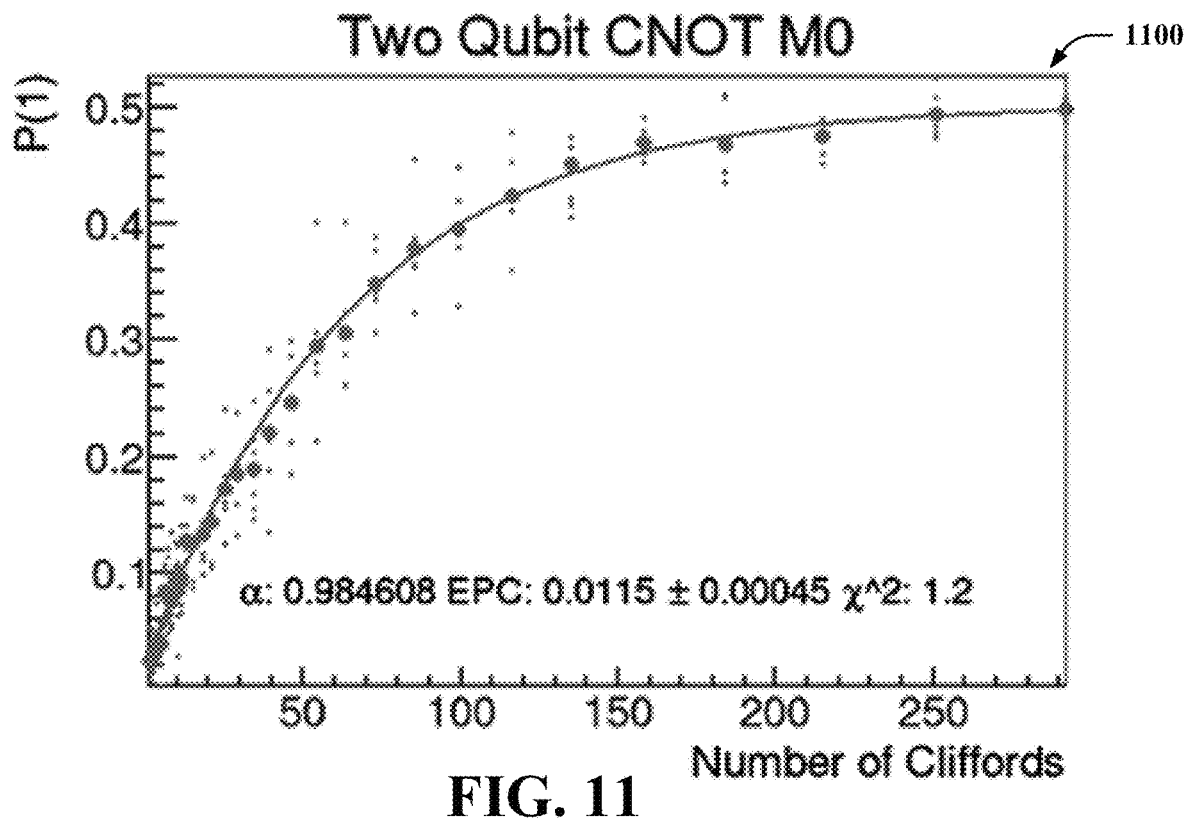
FIGS. 11-12 illustrate example, non-limiting graphs that depict static ZZ interaction reduction facilitated by CW tones during two qubit gate operations, in accordance with one or more embodiments described herein.
Figure 12:
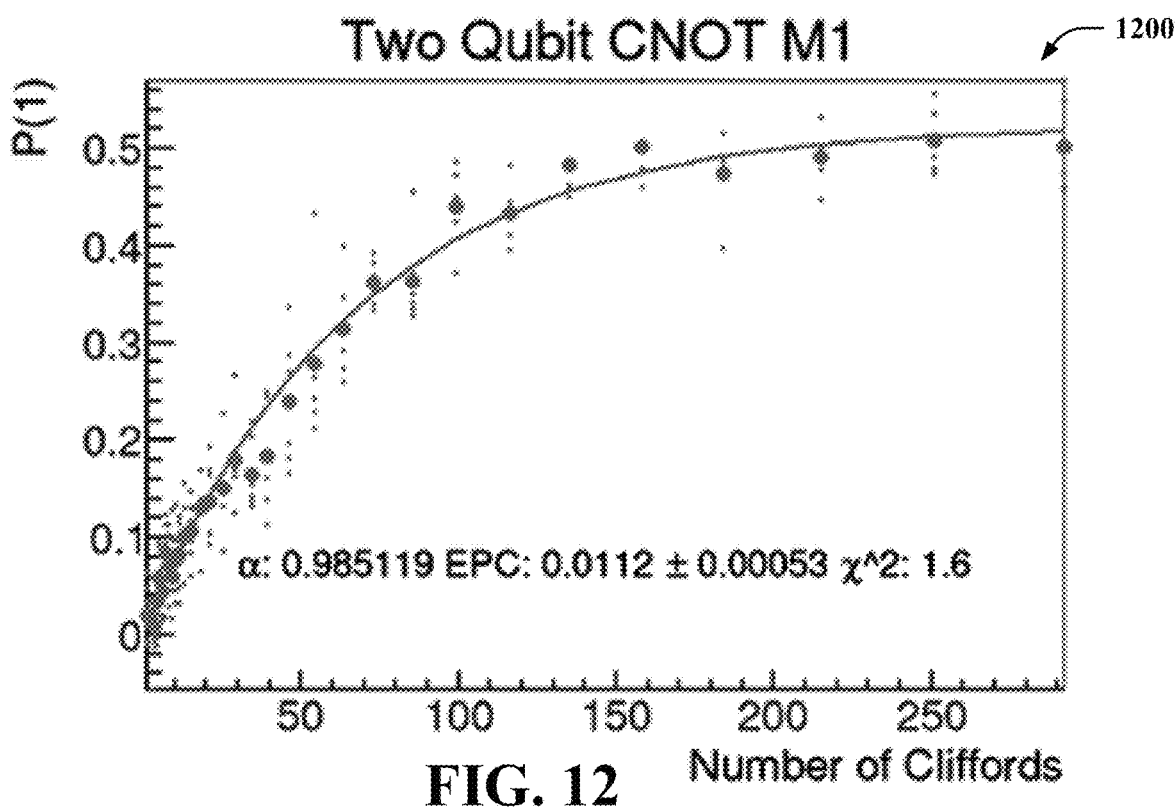

FIGS. 11-12 illustrate an example of static ZZ interaction reduction facilitated by CW tones during a two-qubit RB run, in accordance with one or more embodiments described herein. In particular, graph 1100 of FIG. 11 and graph 1200 of FIG. 12 illustrate results of a two-qubit RB run executed on first qubit 120 and second qubit 130, respectively, with biasing component 110 using CW tones to facilitate control of ZZ static interactions. A Y-axis (e.g., the vertical axis of graph 1100) of each graph depicted in FIGS. 11-12 represents a respective |1⟩ excited state population and an X-axis (e.g., the horizontal axis of graph 1100) of each graph depicted in FIGS. 11-12 represents a Clifford Length or a number of Cliffords. In an embodiment, the Y-axis of each graph depicted in FIGS. 7-10 can correspond to a unitless fraction. In this example, first qubit 120 and second qubit 130 can have resonant frequencies of 4963.9 megahertz (MHz) and 4841.3 MHz, respectively. In this example, first qubit 120 can have average T1 and T2 coherence times of 158.1 microsecond (μs) and 144.6 μs, respectively. In this example, second qubit 130 can have average T1 and T2 coherence times of 123.9 μs and 126.7 μs, respectively.

To execute the two-qubit RB run on first qubit 120 and second qubit 130, biasing component 110 can apply a two-qubit entangling pulse tone to first qubit 120 via first drive line 125. That application of the two-qubit entangling pulse tone can induce a two-qubit gate operation (e.g., a CNOT gate via cross resonance) between first qubit 120 and second qubit 130. In this example, biasing component 110 can also apply CW tones via first drive line 125 and second drive line 135 that each have a frequency of 5000 MHz while executing the two-qubit RB run on first qubit 120 and second qubit 130. In this example, a static ZZ interaction between first qubit 120 and second qubit 130 while executing the two-qubit RB run can be approximately 8 kHz. Graphs 1100 and 1200 show that first qubit 120 and second qubit 130 can each have an average error-rate per gate (EPC/1.5) of approximately 0.8% with biasing component 110 using CW tones to facilitate control of ZZ static interactions.

Figure 13:
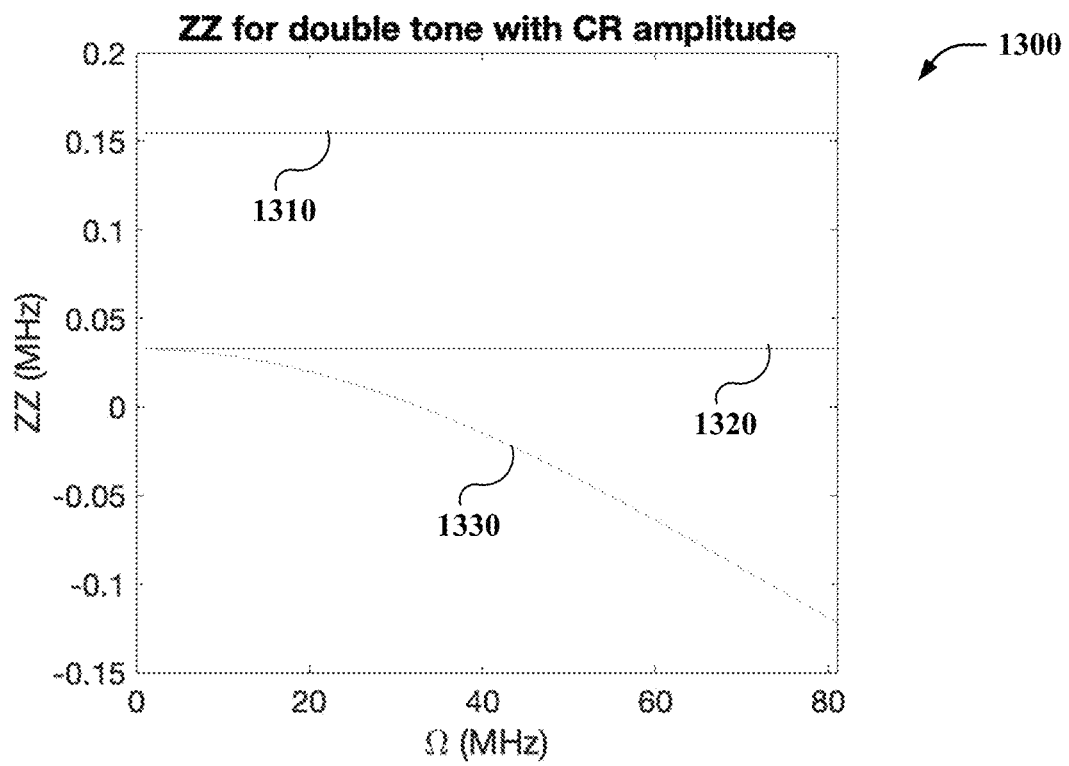
FIG. 13 illustrates an example, non-limiting graph depicting ZZ interaction strength as a function of cross-resonance drive strength, in accordance with one or more embodiments described herein.
Figure 14:
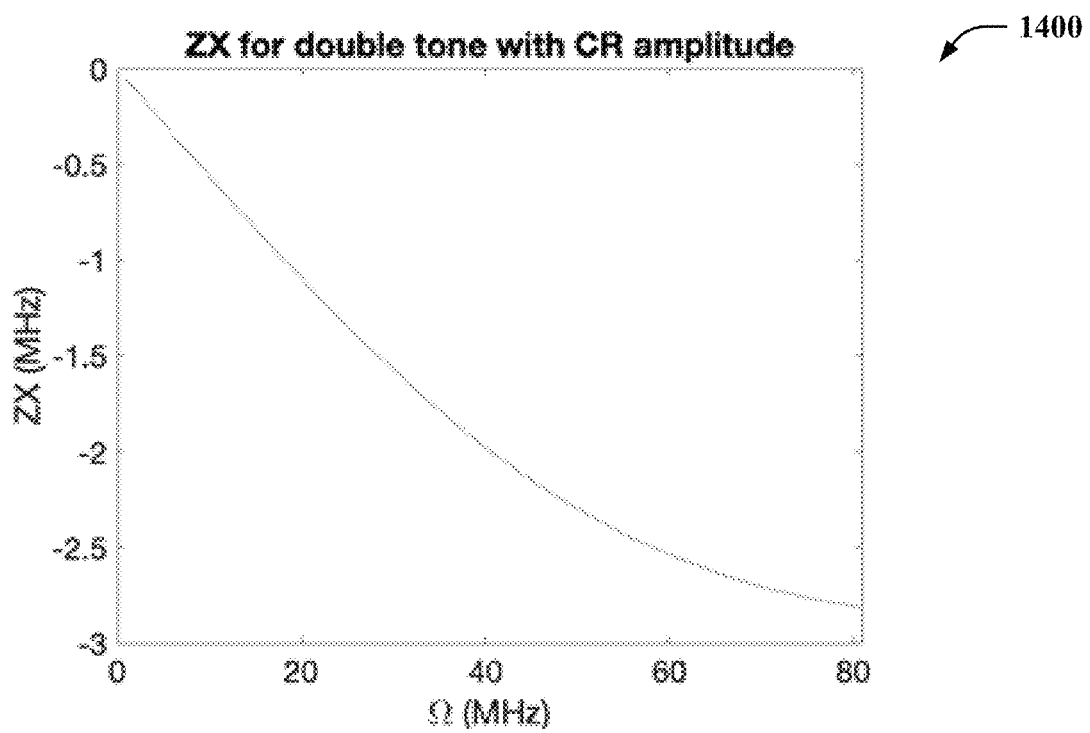
FIG. 14 illustrates an example, non-limiting graph depicting ZX rate as a function of cross-resonance drive strength, in accordance with one or more embodiments described herein.

FIG. 13 illustrates an example, non-limiting graph 1300 depicting ZZ interaction strength between first qubit 120 and second qubit 130 as a function of cross-resonance drive strength (or amplitude), in accordance with one or more embodiments described herein. In graph 1300, line 1310 corresponds to static ZZ interaction between first qubit 120 and second qubit 130; line 1320 corresponds to the ZZ interaction between first qubit 120 and second qubit 130 after the CW Stark drive tone; and line 1330 corresponds to the ZZ interaction between first qubit 120 and second qubit 130 after an additional cross-resonance drive tone. FIG. 14 illustrates an example, non-limiting graph 1400 depicting ZX interaction strength as a function of cross-resonance drive strength (or amplitude), in accordance with one or more embodiments described herein. FIGS. 13-14 illustrate another embodiment in which biasing component 110 can facilitate dynamic control of ZZ interactions between first qubit 120 and second qubit 130 using CW tone 202 and CW tone 252.

In the embodiment illustrated by FIGS. 13-14, first qubit 120 and second qubit 130 can have resonant frequencies of approximately 4963.9 MHz and 4841.2 MHz, respectively. In FIGS. 13-14, first qubit 120 and second qubit 130 can each also have a qubit anharmonicity of −300 MHz and an exchange coupling strength J of 4.4 MHz. CW tone 202 and CW tone 252 can have a common frequency (e.g., 5000 MHz) that can be defined using a frequency that is off-resonant from respective transitions of first qubit 120 or second qubit 130. Biasing component 110 can set the relative phase difference between CW tone 202 and CW tone 252 at approximately π radians. In FIGS. 13-14, biasing component 110 can calibrate a ZZ interaction between first qubit 120 and second qubit 130 to cancel a net ZZ interaction during a two-qubit gate operation. To that end, biasing component 110 can tune the first drive amplitude $\Omega_0$ of CW tone 202 and the second drive amplitude $\Omega_1$ of CW tone 252 to 16.09 MHz and 17.35 MHz, respectively. In doing so, the net ZZ interaction during the two-qubit gate operation can be substantially zero for ZX operation at approximately 30 MHz of cross-resonance tone amplitude, as shown by FIGS. 13 and 14.

Figure 15:
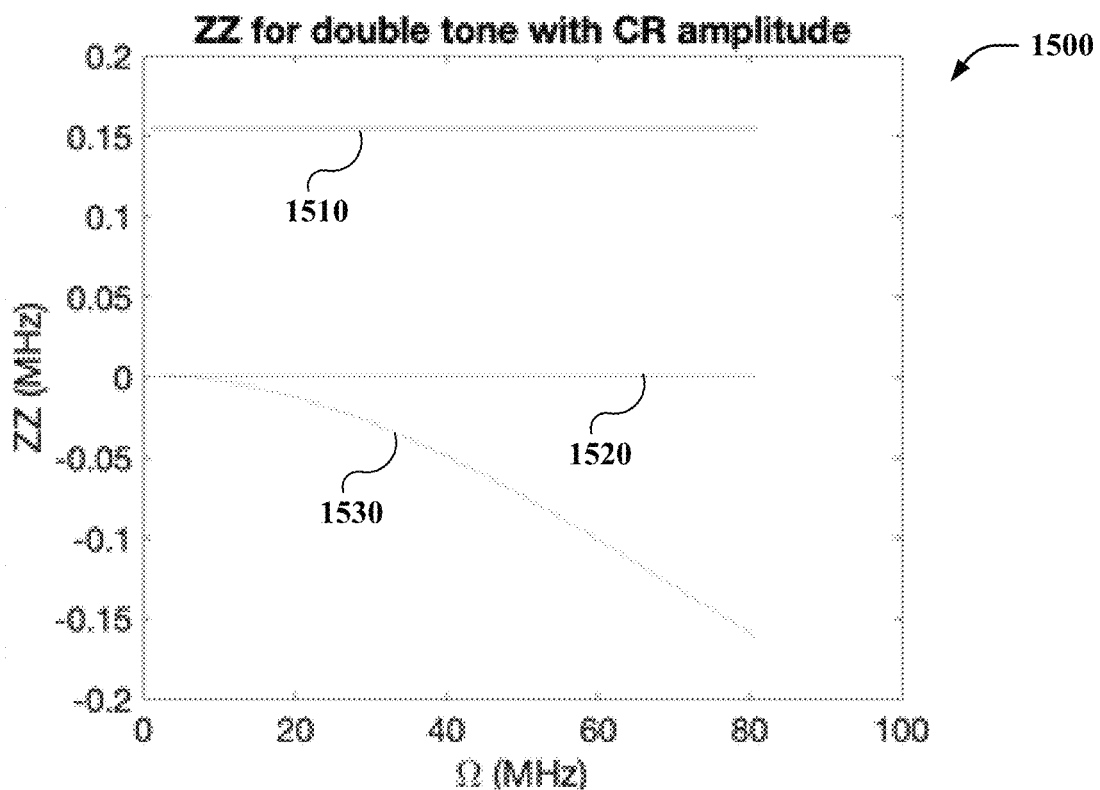
FIG. 15 illustrates another example, non-limiting graph depicting ZZ interaction strength as a function of cross-resonance drive strength, in accordance with one or more embodiments described herein.
Figure 16:
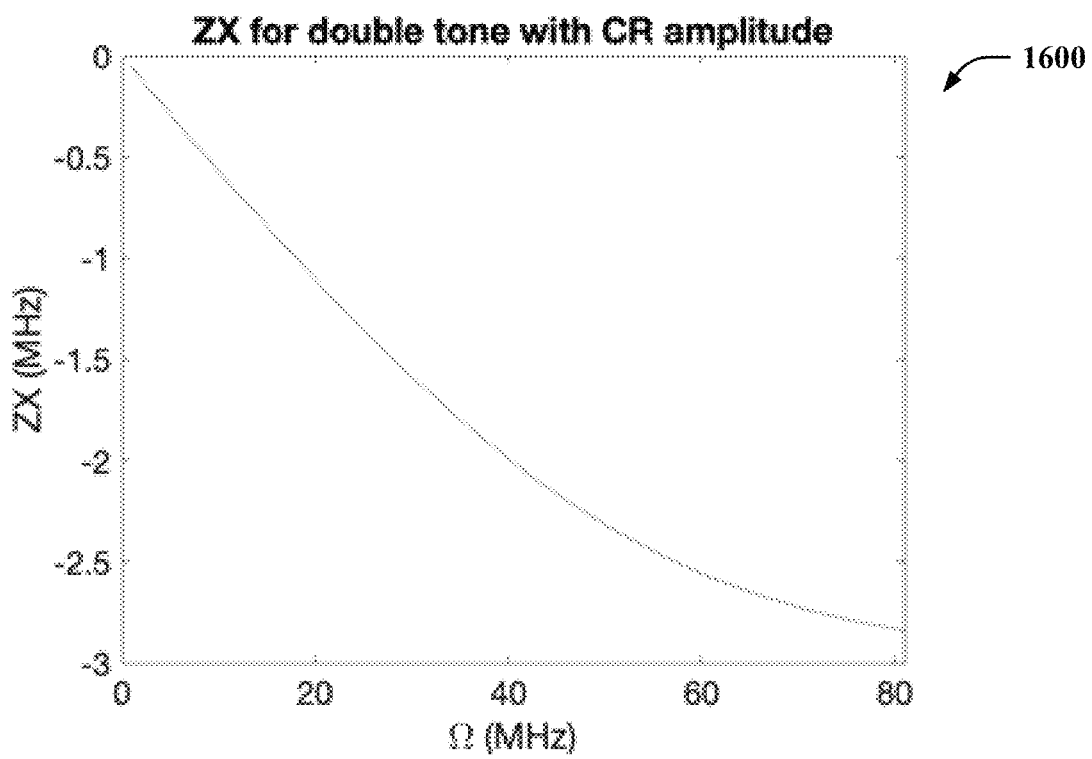
FIG. 16 illustrates another example, non-limiting graph depicting ZX rate as a function of cross-resonance drive strength, in accordance with one or more embodiments described herein.

FIG. 15 illustrates an example, non-limiting graph 1500 depicting ZZ interaction strength between first qubit 120 and second qubit 130 as a function of cross-resonance drive strength (or amplitude), in accordance with one or more embodiments described herein. In graph 1500, line 1510 corresponds to static ZZ interaction between first qubit 120 and second qubit 130; line 1520 corresponds to the ZZ interaction between first qubit 120 and second qubit 130 after the CW Stark drive tone; and line 1530 corresponds to the ZZ interaction between first qubit 120 and second qubit 130 after an additional cross-resonance drive tone. FIG. 16 illustrates an example, non-limiting graph 1600 depicting ZX interaction strength as a function of cross-resonance drive strength (or amplitude), in accordance with one or more embodiments described herein. FIGS. 15-16 illustrate another embodiment in which biasing component 110 can facilitate dynamic control of ZZ interactions between first qubit 120 and second qubit 130 using CW tone 202 and CW tone 252.

In the embodiment illustrated by FIGS. 15-16, the respective resonant frequencies and qubit anharmonicities of first qubit 120 and second qubit 130 can remain unchanged from the embodiment illustrated by FIGS. 13-14. Moreover, the respective frequencies of CW tone 202 and CW tone 252 can remain 5000 MHz. In FIGS. 15-16, first qubit 120 and second qubit 130 can also have an exchange coupling strength J of 4.4 MHz. Biasing component 110 can set the relative phase difference between CW tone 202 and CW tone 252 at approximately $\pi$ radians. In FIGS. 15-16, biasing component 110 can tune CW tone 202 and CW tone 252 to cancel static ZZ interaction between first qubit 120 and second qubit 130 during a two-qubit gate operation. To that end, biasing component 110 can tune the first drive amplitude $\Omega_0$ of CW tone 202 and the second drive amplitude $\Omega_1$ of CW tone 252 to 17 MHz and 21.8 MHz, respectively. In doing so, the static ZZ interaction during the two-qubit gate operation can be substantially zero, as shown by FIGS. 15 and 16.

Figure 17:
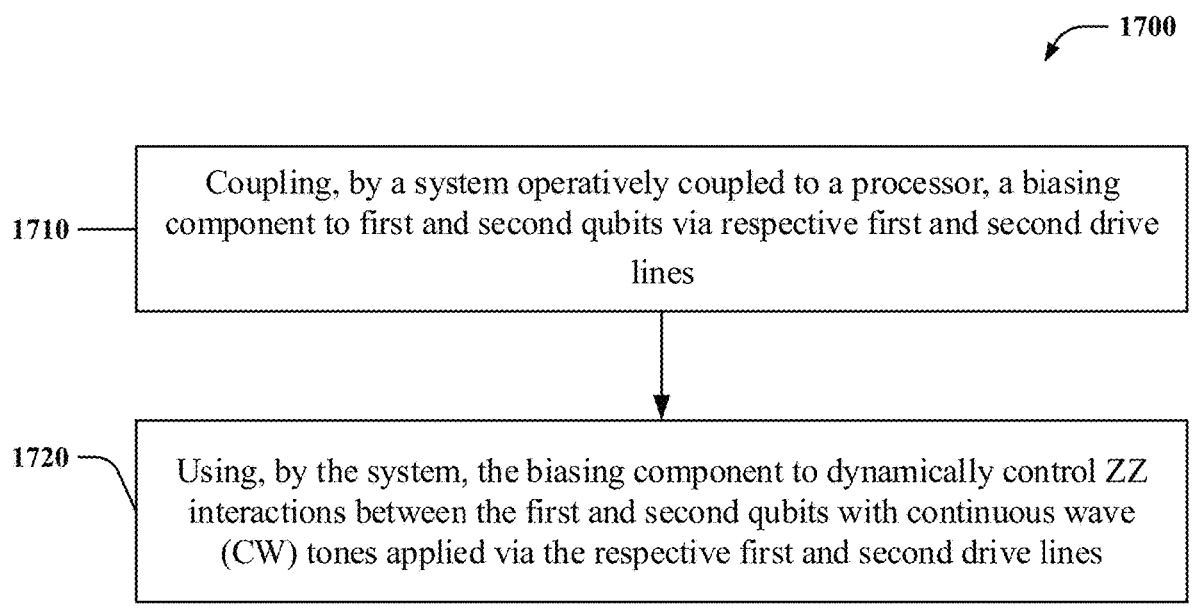
FIG. 17 illustrates a flow diagram of an example, non-limiting computer-implemented method of facilitating dynamic control of ZZ interactions for quantum computing devices, in accordance with one or more embodiments described herein.

FIG. 17 illustrates a flow diagram of an example, non-limiting computer-implemented method 1700 of facilitating dynamic control of ZZ interactions for quantum computing devices, in accordance with one or more embodiments described herein. Repetitive description of like elements employed in other embodiments described herein is omitted for sake of brevity. At 1710, the computer-implemented method 1700 can comprise coupling, by a system operatively coupled to a processor, a biasing component (e.g., biasing component 110 of FIG. 1) to first and second qubits (e.g., first qubit 120 and second qubit 130) via respective first and second drive lines (e.g., first drive line 125 and second drive line 135).

At 1720, the computer-implemented method 1700 can comprise using, by the system, the biasing component to dynamically control ZZ interactions between the first and second qubits with CW tones applied via the respective first and second drive lines. In an embodiment, the system can use the biasing component to dynamically control ZZ interactions between the first and second qubits by dynamically adjusting a relative phase difference between the CW tones, wherein dynamically adjusting the relative phase difference cancels a static ZZ interaction between the first and second qubits. In an embodiment, the system can use the biasing component to dynamically control ZZ interactions between the first and second qubits by dynamically adjusting an amplitude of at least one CW tone among the CW tones applied via the respective first and second drive lines tones. In an embodiment, dynamically adjusting the amplitude of the at least one CW tone can cancel a static ZZ interaction between the first and second qubits. In an embodiment, the system can use the biasing component to dynamically control ZZ interactions between the first and second qubits by calibrating a ZZ interaction between the first and second qubits in order to cancel a net ZZ interaction during a two-qubit gate operation between the first and second qubits. In an embodiment, the system can use the biasing component to dynamically control ZZ interactions between the first and second qubits by tuning the CW tones to cancel a ZZ interaction between the first and second qubits.

In an embodiment, the computer-implemented method 1700 can further comprise recalibrating, by the system, respective operating frequencies of the first and second qubits while the CW tones are tuned to cancel the ZZ interaction. In an embodiment, the system can recalibrate the respective operating frequencies of the first and second qubits using Ramsey pulse sequences.

Figure 18:
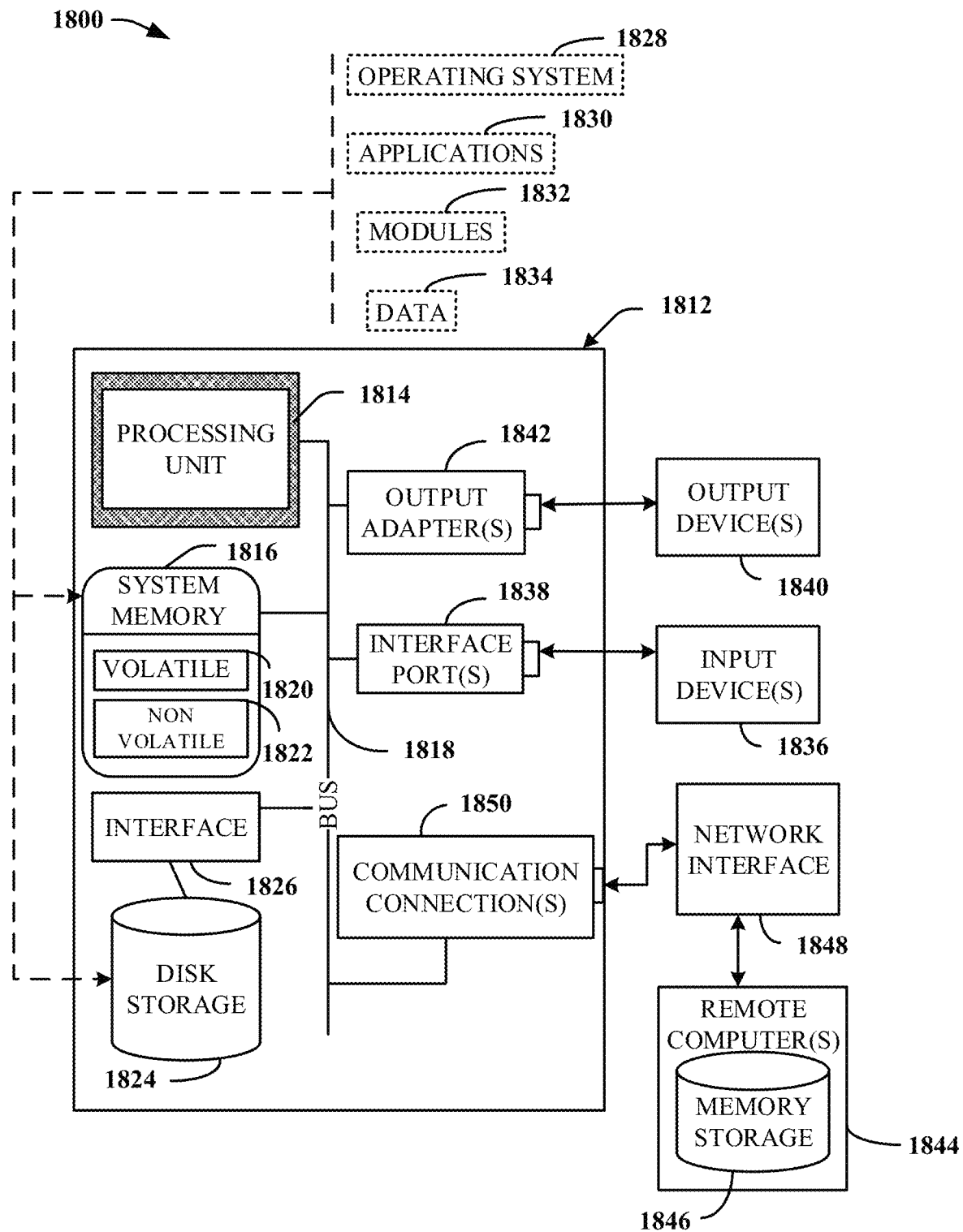
FIG. 18 illustrates a block diagram of an example, non-limiting operating environment in which one or more embodiments described herein can be facilitated.

In order to provide a context for the various aspects of the disclosed subject matter, FIG. 18 as well as the following discussion are intended to provide a general description of a suitable environment in which the various aspects of the disclosed subject matter can be implemented. FIG. 18 illustrates a suitable operating environment 1800 for implementing various aspects of this disclosure can also include a computer 1812. The computer 1812 can also include a processing unit 1814, a system memory 1816, and a system bus 1818. The system bus 1818 couples system components including, but not limited to, the system memory 1816 to the processing unit 1814. The processing unit 1814 can be any of various available processors. Dual microprocessors and other multiprocessor architectures also can be employed as the processing unit 1814. The system bus 1818 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1094), and Small Computer Systems Interface (SCSI). The system memory 1816 can also include volatile memory 1820 and nonvolatile memory 1822. The basic input/output system (BIOS), containing the basic routines to transfer information between elements within the computer 1812, such as during start-up, is stored in nonvolatile memory 1822. By way of illustration, and not limitation, nonvolatile memory 1822 can include read only memory (ROM), programmable ROM (PROM), electrically programmable ROM (EPROM), electrically erasable programmable ROM (EEPROM), flash memory, or nonvolatile random-access memory (RAM) (e.g., ferroelectric RAM (FeRAM). Volatile memory 1820 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 1812 can also include removable/non-removable, volatile/non-volatile computer storage media. FIG. 18 illustrates, for example, a disk storage 1824. Disk storage 1824 can also include, but is not limited to, devices like a magnetic disk drive, floppy disk drive, tape drive, Jaz drive, Zip drive, LS-100 drive, flash memory card, or memory stick. The disk storage 1824 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1824 to the system bus 1818, a removable or non-removable interface is typically used, such as interface 1826. FIG. 18 also depicts software that acts as an intermediary between users and the basic computer resources described in the suitable operating environment 1800. Such software can also include, for example, an operating system 1828. Operating system 1828, which can be stored on disk storage 1824, acts to control and allocate resources of the computer 1812. System applications 1830 take advantage of the management of resources by operating system 1828 through program modules 1832 and program data 1834, e.g., stored either in system memory 1816 or on disk storage 1824. It is to be appreciated that this disclosure can be implemented with various operating systems or combinations of operating systems. A user enters commands or information into the computer 1812 through input device(s) 1836. Input devices 1836 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1814 through the system bus 1818 via interface port(s) 1838. Interface port(s) 1838 include, for example, a serial port, a parallel port, a game port, and a universal serial bus (USB). Output device(s) 1840 use some of the same type of ports as input device(s) 1836. Thus, for example, a USB port can be used to provide input to computer 1812, and to output information from computer 1812 to an output device 1840. Output adapter 1842 is provided to illustrate that there are some output devices 1840 like monitors, speakers, and printers, among other output devices 1840, which require special adapters. The output adapters 1842 include, by way of illustration and not limitation, video and sound cards that provide a means of connection between the output device 1840 and the system bus 1818. It can be noted that other devices and/or systems of devices provide both input and output capabilities such as remote computer(s) 1844.

Computer 1812 can operate in a networked environment using logical connections to one or more remote computers, such as remote computer(s) 1844. The remote computer(s) 1844 can be a computer, a server, a router, a network PC, a workstation, a microprocessor-based appliance, a peer device or other common network node and the like, and typically can also include many or the elements described relative to computer 1812. For purposes of brevity, only a memory storage device 1846 is illustrated with remote computer(s) 1844. Remote computer(s) 1844 is logically connected to computer 1812 through a network interface 1848 and then physically connected via communication connection 1850. Network interface 1848 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1850 refers to the hardware/software employed to connect the network interface 1848 to the system bus 1818. While communication connection 1850 is shown for illustrative clarity inside computer 1812, it can also be external to computer 1812. The hardware/software for connection to the network interface 1848 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices. For example, in one or more embodiments, computer executable components can be executed from memory that can include or be comprised of one or more distributed memory units. As used herein, the term "memory" and "memory unit" are interchangeable. Further, one or more embodiments described herein can execute code of the computer executable components in a distributed manner, e.g., multiple processors combining or working cooperatively to execute code from one or more distributed memory units. As used herein, the term "memory" can encompass a single memory or memory unit at one location or multiple memories or memory units at one or more locations.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A quantum device, comprising:
   a biasing component that is operatively coupled to first and second qubits via respective first and second drive lines, wherein the biasing component facilitates dynamic control of ZZ interactions between the first and second qubits using continuous wave (CW) tones applied via the respective first and second drive lines, wherein the CW tones applied via the respective first and second drive lines comprise a common frequency.

2. The quantum device of claim 1, wherein the biasing component facilitates dynamic control of ZZ interactions between the first and second qubits by dynamically adjusting a relative phase difference between the CW tones.

3. The quantum device of claim 2, wherein dynamically adjusting the relative phase difference between the CW tones cancels a static ZZ interaction between the first and second qubits.

4. The quantum device of claim 2, wherein respective amplitudes of the CW tones remain constant while the relative phase difference between the CW tones is dynamically adjusted.

5. The quantum device of claim 1, wherein the common frequency is defined using a frequency that is off-resonant from respective transitions of the first or second qubits.

6. The quantum device of claim 1, wherein the biasing component facilitates dynamic control of ZZ interactions between the first and second qubits by calibrating a ZZ interaction between the first and second qubits to cancel a net ZZ interaction during a two-qubit gate operation between the first and second qubits.

7. The quantum device of claim 6, wherein the net ZZ interaction has a magnitude based on an exchange coupling strength between the first and second qubits.

8. The quantum device of claim 1, wherein the biasing component facilitates dynamic control of ZZ interactions between the first and second qubits by dynamically adjusting an amplitude of at least one CW tone among the CW tones applied via the respective first and second drive lines.

9. The quantum device of claim 8, wherein dynamically adjusting the amplitude of the at least one CW tone cancels a static ZZ interaction between the first and second qubits.

10. The quantum device of claim 8, wherein the relative phase difference between the CW tones remains constant while the amplitude of the at least one of the CW tones is dynamically adjusted.

11. The quantum device of claim 1, wherein the biasing component facilitates dynamic control of ZZ interactions between the first and second qubits by tuning the CW tones to cancel a ZZ interaction between the first and second qubits.

12. The quantum device of claim 11, wherein the biasing component further recalibrates respective operating frequencies of the first and second qubits while the CW tones are tuned to cancel the ZZ interaction.

13. A computer-implemented method comprising:
coupling, by a system operatively coupled to a processor, a biasing component to first and second qubits via respective first and second drive lines; and
using, by the system, the biasing component to dynamically control ZZ interactions between the first and second qubits with continuous wave (CW) tones applied via the respective first and second drive lines, wherein the CW tones comprise a common frequency.

14. The computer-implemented method of claim 13, wherein the system uses the biasing component to dynamically control ZZ interactions between the first and second qubits by dynamically adjusting a relative phase difference between the CW tones, wherein dynamically adjusting the relative phase difference cancels a static ZZ interaction between the first and second qubits.

15. The computer-implemented method of claim 13, wherein the system uses the biasing component to dynamically control ZZ interactions between the first and second qubits by dynamically adjusting an amplitude of at least one CW tone among the CW tones applied via the respective first and second drive lines tones, and wherein dynamically adjusting the amplitude of the at least one CW tone cancels a static ZZ interaction between the first and second qubits.

16. The computer-implemented method of claim 13, wherein the system uses the biasing component to dynamically control ZZ interactions between the first and second qubits by calibrating a ZZ interaction between the first and second qubits in order to cancel a net ZZ interaction during a two-qubit gate operation between the first and second qubits.

17. The computer-implemented method of claim 13, wherein the system uses the biasing component to dynamically control ZZ interactions between the first and second qubits by tuning the CW tones to cancel a ZZ interaction between the first and second qubits.

18. The computer-implemented method of claim 17, further comprising:
recalibrating, by the system, respective operating frequencies of the first and second qubits while the CW tones are tuned to cancel the ZZ interaction.

19. A computer program product comprising a computer readable storage medium having program instructions embodied therewith, the program instructions executable by a processor to cause the processor to:
operatively couple, by the processor, a biasing component to first and second qubits via respective first and second drive lines; and
use, by the processor, the biasing component to facilitate dynamic control of ZZ interactions between the first and second qubits with continuous wave (CW) tones applied via the respective first and second drive lines, wherein the CW tones applied via the respective first and second drive lines comprise a common frequency.

20. The computer program product of claim 19, wherein the processor uses the biasing component to facilitate dynamic control of ZZ interactions between the first and second qubits by dynamically adjusting a relative phase difference between the CW tones or by adjusting an amplitude of at least one of the CW tones or by dynamically adjusting an amplitude of at least one CW tone among the CW tones applied via the respective first and second drive lines tones.

21. A quantum device, comprising:
a biasing component that is operatively coupled to first and second qubits via respective first and second drive lines, wherein the biasing component facilitates dynamic control of ZZ interactions between the first and second qubits by dynamically adjusting a relative phase difference between continuous wave (CW) tones applied via the respective first and second drive lines, and wherein the CW tones comprise a frequency that is off-resonant from respective transitions of the first or second qubits.

22. The quantum device of claim 21, wherein the biasing component further facilitates dynamic control of ZZ interactions between the first and second qubits by calibrating a ZZ interaction between the first and second qubits in order to cancel a net ZZ interaction during a two-qubit gate operation between the first and second qubits.

23. A quantum device, comprising:
a biasing component that is operatively coupled to first and second qubits via respective first and second drive lines, wherein the biasing component facilitates dynamic control of ZZ interactions between the first and second qubits by dynamically adjusting a first amplitude of a first continuous wave (CW) tone applied via the first drive line, dynamically adjusting a second amplitude of a second CW tone applied via the second drive line, or a combination thereof.

24. The quantum device of claim 23, wherein the biasing component further facilitates dynamic control of ZZ interactions between the first and second qubits by calibrating a ZZ interaction between the first and second qubits in order to cancel a net ZZ interaction during a two-qubit gate operation between the first and second qubits.

* * * * *